United States Patent [19]

Wada et al.

[11] Patent Number: 5,049,221
[45] Date of Patent: Sep. 17, 1991

[54] PROCESS FOR PRODUCING A COPPER-CLAD LAMINATE

[75] Inventors: Tatsuo Wada, Ebina; Keizo Yamashita, Shizuoka; Tasuku Touyama, Shimizu; Teruaki Yamamoto, Shizuoka, all of Japan

[73] Assignee: Meiko Electronics Co., Ltd., Ayase, Japan

[21] Appl. No.: 345,906

[22] Filed: May 1, 1989

Related U.S. Application Data

[63] Continuation-in-part of Ser. No. 117,170, filed as PCT JP87/00112 on Feb. 21, 1987, published as WO87/04977 on Aug. 27, 1987, abandoned.

[30] Foreign Application Priority Data

| Feb. 21, 1986 | [JP] | Japan | 61-036709 |
| Feb. 21, 1986 | [JP] | Japan | 61-036710 |
| Feb. 21, 1986 | [JP] | Japan | 61-036711 |

[51] Int. Cl.$^5$ ............................................. C25D 5/08
[52] U.S. Cl. .............................. 156/151; 156/233; 156/239; 156/241; 156/630; 204/12; 204/281
[58] Field of Search ........... 156/151, 241, 233, 630, 156/239; 204/12, 281

[56] References Cited

U.S. PATENT DOCUMENTS

| 1,589,564 | 6/1926 | Robinson | 204/12 |
| 4,053,370 | 10/1977 | Yamashita et al. | 204/13 |
| 4,240,894 | 12/1980 | Adler | 204/281 |
| 4,503,112 | 3/1985 | Konicek | 156/151 |
| 4,715,116 | 12/1987 | Thorpe et al. | 156/233 |

Primary Examiner—John J. Gallagher
Attorney, Agent, or Firm—Frishauf, Holtz, Goodman & Woodward

[57] ABSTRACT

A process for producing a copper-clad laminate, which comprises a step (S2) of forming a copper foil of at least several micrometers on a planar conductive substrate by electrolysis, a step (S3) of roughening the surface of the copper foil, a step (S4) of laminating the copper foil together with the conductive substrate on an insulating substrate and tightly integrating the assembly by applying pressure and heat, and a step (S5) of separating only the conductive substrate. A metal film may exist between the conductive substrate and the copper foil. When the metal film has a thickness of 0.1 to 3 $\mu$m, only the conductive substrate is separated with the metal film being firmly adhered to the copper foil surface and, when the metal film has a thickness of 70 to 250 $\mu$m, it is separated together with the conductive substrate after the lamination. The copper foil formed by high-speed plating under the conditions of 6 to 12.0 m/sec in solution contact speed and 0.8 to 4.0 A/cm$^2$ in current density has about the same flexibility as that of rolled and annealed copper. Thus, ultrathin copper-clad laminates with a copper foil of 10 $\mu$m or less suited for flexible circuit boards can be produced in a short time using small equipment.

12 Claims, 11 Drawing Sheets

PROCESS FOR PRODUCING A COPPER-CLAD LAMINATE

DESCRIPTION

Cross Reference

This is a continuation-in-part application of U.S. Ser. No. 117,170, filed as PCT JP87/00112 on Feb. 21, 1987, published as WO87/ now abandoned.

TECHNICAL FIELD

The present invention relates to a process for producing a copper-clad laminate adapted for the manufacture of an ultrathin copper-clad laminate whose main copper foil is 10 μm or less in thickness.

BACKGROUND ART

With an advance in high density and miniaturization of recent printed circuit boards, there is a demand for a method capable of producing at high speed an ultrathin copper-clad laminate whose main copper foil has a thickness of 10 μm or less.

Printed circuit boards or copper-clad laminates which are manufactured by the so-called transfer method are conventionally known. Examples of such boards or laminates are disclosed in Japanese Patent Publication No. 55-24141, Japanese Patent Publication No. 55-32239 (U.S. Pat. No. 4,053,370), Japanese Patent Publication No. 57-24080, Japanese Patent Publication No. 57-39318, Japanese Patent Disclosure No. 60-147192, U.S. Pat. No. 4,715,116, etc.

In a process (hereinafter referred to as belt transfer process) for producing printed circuit boards disclosed in Japanese Patent Publication No. 55-24141, Japanese Patent Publication No. 55-32239 (U.S. Pat. No. 4,053,370), Japanese Patent Publication No. 57-24080, and Japanese Patent Publication No. 57-39318, a printed circuit board is produced in the following manner. A thin, electrically conductive metal belt, which slides on the outer peripheral surface of a metallic rotating drum or a cathode portion of a horizontal plating apparatus, is used as a cathode. The metal belt is transported while being kept at a predetermined distance from an insoluble anode. A plating solution is supplied forcibly between the metal belt and the anode at high speed, thereby electrolytically forming a copper circuit on the surface of the metal belt. After an insulating substrate having a bonding agent previously applied thereto is adhered to the copper circuit, the insulating substrate and the copper circuit are separated from the metal belt. Thus, the printed circuit board is completed. Adapted for high-speed plating, the belt transfer process has the advantage over conventional methods that it permits very fast deposition of copper and continuous production of the printed circuit boards. However, the belt transfer process is associated with the following drawbacks. During a separation step in which the insulating substrate having the copper circuit transferred thereto is separated from the metal belt, part of the copper circuit may not be able to be transferred to the insulating substrate, due to the difference between the strength of adhesion between the copper circuit and the metal belt surface and that between the insulating substrate and the surface of the copper circuit, and other causes. For the same reason, the copper circuit may swing or be deformed during the transfer and separation steps, thereby causing defects such as wrinkling, breakage, bruises, cracks, etc.

The belt transfer process is usually employed to produce printed circuit boards. When applying it to the manufacture of copper-clad laminates, the following problems arise.

In the belt transfer process, a long metal belt is generally used as the electrically conductive substrate, but in the case of manufacturing copper-clad laminates, it is essential that the width (510 to 1,020 mm at the least) of the copper-clad laminate produced is greater than that of a printed wiring to be formed. Further, when employing the belt transfer method for transferring copper circuits or copper foils and also using the so-called reel-to-reel method disclosed in Japanese Patent Publication No. 57-24080, it is desirable to use a relatively thin metal belt with a thickness of the order of 0.2 to 0.8 mm, in view of the residual stress of the belt wound around a roll.

However, a metal belt which is wide and thin and also uniform in structure is hardly available, and if available, such a belt will be very expensive. Further, in general, a metal belt has a lateral swerve of about 5 mm per the length of 20 m, or its side edges are more or less corrugated. Therefore, the belt zigzags as it is run during the belt transfer step, so that portions of the copper foil at the edges of the belt are scraped off by a squeegee bar, thus entailing non-uniform thickness of electrodeposition, as well as machine troubles of the line due to short circuit or flaws in the belt caused by the copper powder scraped off from the copper foil. To eliminate these problems, an auxiliary mechanism such as sensors or the like may be incorporated into the machine line. This, however, results in a remarkable increase of the line cost and a hindrance to improvement of productivity, and accordingly is not a desirable measure from the industrial standpoint.

Particularly when manufacturing ultrathin copper-clad laminates by the belt transfer process, the copper foil is liable to swing or be deformed during the transfer and separation steps, thus causing defects such as wrinkling, breakage, bruises, cracks, etc.

Thus, the conventional belt transfer process cannot be used to produce a copper-clad laminate having a width of 510 to 1,020 mm at least, without arising the various problems.

In the so-called reel-to-reel method disclosed in Japanese Patent Publication No. 57-24080, for example, a metal belt of stainless steel on a reel is wound therefrom by another reel. With this arrangement, the surface of the stainless-steel plate is liable to suffer flaws, soiling, or other damages. If work is suspended to remove soil or flaws on the plate, the formation of the copper foil, in its turn, is spoiled. Thus, according to the reel-to-reel method, the work (line) cannot readily be suspended even when the stainless-steel surface suffers soiling, flaws, or other damages. This results in an increase in fraction defective, reduction in working efficiency, etc.

If stainless steel is used for the metal belt, moreover, inevitable physical or electrochemical defects, such as pores, exist on the surface of the metal belt. According to the belt transfer process, the copper circuit or copper foil is electrolytically precipitated in a direct manner on the surface of the metal belt having such defects, and therefore pinholes tend to be produced in the deposited copper. Particularly when the thickness of deposited copper is 18 μm or less, the defects of the metal belt surface are reflected directly upon the production of pinholes. Therefore, in manufacturing a circuit board including copper circuits of 130 μm wide and having a fine circuit pattern with a width of 130 μm or less, critical defects in quality can be caused, such as deficiency or disconnection of the copper circuits. The problem is particularly serious for high-density conductor circuit boards with a copper circuit width of 100 μm or less and a circuit interval of 100 μm or less.

When the film thickness is 18 μm or more, the number of pinholes is reduced, and when the copper foil thickness is 35 μm, pinholes of this type make no hindrance to the formation of circuits.

For the transfer methods described above, it is essential that the copper foil obtained is free from pinholes and, if some pinholes exist, the number and size thereof are so small that no defects are caused during the formation of a fine pattern as described above.

The occurrence of pinholes generally depends on the surface conditions of the electrically conductive substrate used and the electroplating conditions inclusive of the plating solution used.

For example, an electrically conductive substrates used for the transfer method is produced by rolling an ingot of an electrically conductive material, such as stainless steel, nickel, or copper, into a plate. The electrically conductive substrate produced in this manner, however, is not entirely free from defects, that is, even if a grinding or polishing treatment is applied physically or chemically to the substrate surface, nonmetallic inclusions and intermetallic compounds, mixed in the substrate during the fusion and machining processes, and pores such as oil pits cannot be completely removed from the substrate. Therefore, when metal is electrodeposited on the conductive substrate, the defects of the substrate surface are duplicated onto the electrodeposited metal layer, since the duplication precision of electrodeposited metal is approximately 0.05 μm. Particularly, if undercut pores exist in the substrate surface, copper, for example, enters the pores during the electrodeposition. Accordingly, when the conductive substrate is separated from the insulating substrate after transferring and laminating the electrodeposited copper onto the insulating substrate, part of the electrodeposited copper is torn off at the pores and remain on the conductive substrate, thus producing pinholes corresponding in position to the pores. This situation is observed quite frequently in the manufacture of copper-clad laminates with a thin copper foil of less than 18 μm thick.

A method (hereinafter referred to as conventional transfer method) of producing conductor circuit boards disclosed in Japanese Patent Disclosure No. 60-147192, mentioned above, comprises a step of forming a thin metal layer on the surface of an electrically conductive substrate, a step of roughening the surface of the thin metal layer, a step of forming a resist mask conforming to a printed wiring to be formed, on the thin metal layer, and a step of plating copper on those portions of the substrate on which the resist mask is not formed, to thereby form desired copper circuits. Then, in a subsequent transfer step, the copper circuits, the resist mask and the thin metal layer are transferred together to an insulating substrate, followed by the removal of the thin metal layer by etching and of the resist mask by etching or by a solvent suited for the resist mask.

This conventional transfer method has the advantage over the aforementioned belt transfer process in that the thin metal layer ensures the transfer of the copper circuits and the resist mask to the insulating substrate.

However, the conventional transfer method is concerned with nothing but the manufacture of printed circuit boards, and is not a method for producing wide, copper-clad laminates, in particular, ultrathin copper-clad laminates, at high speed.

There has been proposed another transfer method by U.S. Pat. No. 4,715,116, which comprises a step of electrodepositing a first copper layer, which suffers few pinholes, directly on the polished surface of a smooth metal plate, a step of forming a second copper layer by using a different plating solution, a step of roughening the surface of the second copper layer, a step of pressure-bonding an insulating substrate to the roughened surface of the second copper layer with heat, and a step of detaching the copper layers at the polished surface of the metal plate. In this method, as is described in the embodiment, the first thin copper layer is electrodeposited on the surface of the metal plate (electrically conductive substrate) by using a plating solution of copper cyanide or copper pyrophosphate which produces few pinholes. Then, after copper is electrodeposited on the first copper layer to a predetermined thickness by using a copper sulfate bath, a further copper layer is electrodeposited on the copper layer, using a plating solution different from that used for the second copper layer, followed by the roughening of the copper layer. There is a statement in the specification that the first and second layers are as a whole substantially pinhole-free.

Here, the problem of pinholes will be considered from the viewpoint of electroplating conditions. In the case of using a copper pyrophosphate solution or copper prussiate solution as the plating solution on the premise that the electrically conductive substrate is satisfactorily polished and the electrodeposition step is carried out under ideal conditions, the supply of copper ions to the conductive substrate is controlled by a chelating agent contained in the plating solution. Thus, a copper film consisting of relatively small crystalline grains can be uniformly electrodeposited, and pinholes of the electrodeposited copper film can advantageously be reduced. On the other hand, in the case of using the above plating solution but under the condition that high-speed plating capable of copper deposition at 15 μm/min or more is carried out with use of an insoluble anode to achieve high productivity, oxygen is generated during the electroplating and thus the pH of the plating bath varies, so that the insoluble anode becomes inoperable and no longer functions as the anode. If a soluble anode is used instead, the dissipation of the anode is so drastic during the electroplating that the distance between the cathode (conductive substrate) and the anode cannot be maintained at a constant value. Uniformity in thickness of the electrodeposited copper film is greatly influenced by the precision of the distance between the electrodes, and accordingly, a copper film with a uniform thickness cannot be produced if the interelectrode distance is not maintained at a constant value. Thus, with the above-mentioned plating solutions, it is very difficult to carry out a satisfactory high-speed plating and reduction of the productivity during the formation of a copper foil is unavoidable.

In the method disclosed in the aforementioned U.S. Pat. No. 4,715,116, the current density for the first layer is 1 to 7 A/dm$^2$ (in the case of a copper cyanide solution) or 2.2 to 4.3 A/dm$^2$ (in the case of a copper pyrophosphate solution). Taking the material of the anode used for forming the first layer into account, and also considering the fact that the specification discloses no solution flow speed, the first layer at least is not formed by the high-speed plating method. It is generally known to one of ordinary skill in this technical field that, when the aforementioned plating solution, i.e., copper pyrophosphate solution or copper cyanide solution, is used, electrodeposition effected therein is controlled by the chelating action, and as a result, production of pinholes is remarkably reduced. In the above method, the first copper layer is formed to prevent pinholes, and then the second copper layer is formed on the first copper layer to obtain a copper foil with a desired thickness. To obtain a pinhole-free copper foil with this method, it is essential to carry out a plating process using a copper pyrophosphate solution, etc., which is slow in electrodeposition speed, to form the first copper layer. Moreover, the first and second layers are formed by different plating processes, and accordingly additional plating tank and plating solution must be prepared, making the method not very effective.

The high-speed plating is described in detail in the aforementioned Japanese Patent Publication No. 55-32239 (U.S. Pat. No. 4,053,370). This publication, however, deals with the high-speed plating only from the viewpoint of improving productivity; it does not refer to the problem of pinholes as described above. Further, the process disclosed is for the manufacture of printed circuit boards.

In an alternative prior art process for producing a copper-clad laminate, copper is deposited, by electroplating, to the surface of a carrier made of an aluminum foil 40 to 60 $\mu$m thick, thus forming a copper foil with a thickness of 5 to 10 $\mu$m. Then, an insulating substrate is bonded to the surface of the copper foil for lamination, and the aluminum carrier is removed chemically by means of a chemical agent, or is separated mechanically. In another prior art process, a copper ingot, for example, is rolled into a copper foil with a thickness of about 3 $\mu$m by a multistage rolling mill, and the copper foil is pressure-bonded to an insulating substrate.

In the former process, however, a complicated step is required for the removal of the aluminum-foil carrier, and in addition, the aluminum foil is partly left unremoved even after the foil removal step, due to burrs created during a through hole-forming step. In the latter process, on the other hand, the rolling method for the manufacture of the copper foil is used in place of the plating method in the aforementioned belt transfer process. In this case, if copper is rolled into a foil with a thickness of 3 to 5 $\mu$m, the copper foil obtained inevitably has a size of 100 mm square or less. Thus, copper-clad laminates with a greater width cannot be produced with this method. Further, handling such a thin copper foil alone may result in wrinkling, soiling, etc. of same and accordingly in high cost and low productivity.

DISCLOSURE OF THE INVENTION

The object of the present invention is to provide a process for producing a copper-clad laminate provided with an ultrathin, substantially pinhole-free copper foil thereon and having a necessary size, which is high in productivity and permits minimized equipment and installation space therefor, and which is adapted for the manufacture of a printed circuit board with a high-density circuit pattern.

To achieve the above object, the inventors hereof conducted various researches, and obtained the following findings. The so-called high-speed plating method is needed to attain high productivity with use of minor production equipment and a narrow installation space. Proper electrodepositing conditions for use with the high-speed plating method were able to be determined which can provide a copper foil with few pinholes. Electrolytic plating conditions for the high-speed plating method were able to be determined which can provide a plated surface of a required roughness without the need for a special surface-roughening process. A copper foil can be transferred easily and securely to an insulating substrate after it is formed on the surface of a conductive substrate by the so-called single-plate pressing.

More specifically, in a process for producing a copper-clad laminate according to the present invention, a planar, electrically conductive substrate, for use as a cathode, and a planar anode are spaced at an interelectrode distance of 3 to 30 mm from each other. A copper foil is formed on the surface of the conductive substrate at a deposition speed of 25 to 100 $\mu$m/min, by electroplating in which a plating solution is supplied such that the plating solution comes into contact with the electrodes at a solution contact speed of 6.0 to 12.0 m/sec, and a current density of 0.8 to 4.0 A/cm$^2$ is applied. After the surface of the copper foil is roughened, an insulating substrate and the conductive substrate are laminated and pressure-bonded together, with the thus formed copper foil therebetween, with use of heat. Thereafter, the copper foil and the insulating substrate are separated together from the conductive substrate.

Preferably, in the aforementioned steps of production, a metal film with a thickness of 0.1 to 3 $\mu$m is formed on the surface of the conductive substrate in advance of the formation of the copper foil, and it is separated together with the copper foil.

Preferably, in the aforementioned steps of production, a metal film with a thickness of 70 to 250 $\mu$m is formed on the surface of the conductive substrate in advance of the formation of the copper foil, and it is separated with the metal film left on the surface of the conductive substrate.

The following three points are effects which can be claimed for the use of the above-described metal film between the single-plate conductive substrate and the copper foil.

(1) The conductive-substrate single plate, with the interposition of the metal film, is superposed on the insulating substrate, and the resulting structure is pressurized and heated for a predetermined period of time by a press. After the structure solidifies as a laminate, the single plate and the metal film can be separated from each other with a peeling strength of 70 to 120 g/cm. Thus, transfer lamination can be accomplished easily without entailing change of dimensions or defective appearance.

(2) Even after the surface of the single-plate conductive substrate (e.g., stainless steel) is fully polished chemically and physically, ingredients in the substrate may slip off due to nonmetallic inclusions in the substrate or electrochemical defects thereof, or intermetallic compounds, segregations, pores, etc., may remain on the substrate surface. These defects cannot be fully offset in an economical manner. The metal film of the present invention can offset these defects of the substrate, so that pinholes cannot be produced. Thus, a circuit substrate having a fine pattern with a width of 100 $\mu$m or less can be manufactured easily and at low cost.

(3) After the metal film and the copper foil are formed on the single-plate conductive substrate, the resulting structure is transferred to the insulating substrate for lamination in a step of pressure bonding with heat. In doing this, a bonding agent of B-stage resin applied to or impregnated into the insulating substrate melts and is urged to flow out to the peripheral surface of the single-plate conductive substrate during the processes of its gelling and solidification. Since the metal film is extended to the peripheral portion of the single-plate conductive substrate so as to cover its surface, the overflowed solidified resin remains on the metal film. In the steps of transfer lamination and separation, therefore, the resin can be easily separated from the boundary (interface) between the single-plate conductive substrate and the metal film. Thus, the resin can never adhere or stick to the single-plate conductive substrate.

BEST MODE OF CARRYING OUT THE INVENTION

Figure 1:
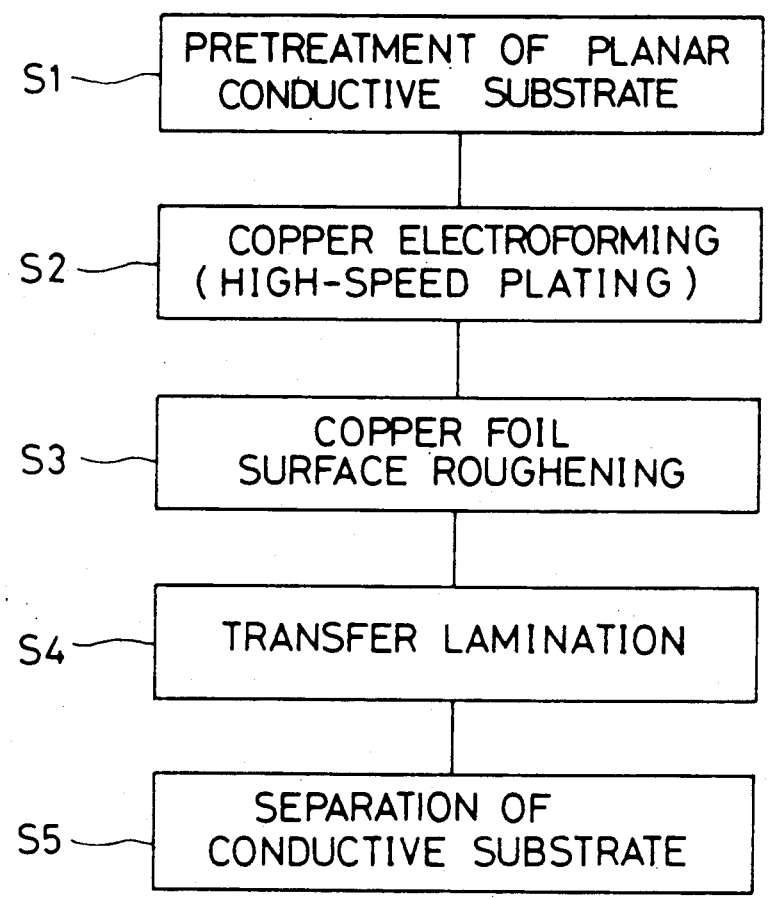
FIG. 1 is a process flow chart for illustrating manufacturing steps of a process for producing a copper-clad laminate according to the present invention.

Referring now to FIGS. 1 to 10, steps of manufacturing a copper-clad laminate according to the present invention will be described.

An electrically conductive substrate 2 used to effect the process of the invention is formed from a rigid single plate, e.g., a planar conductive material of a suitable size, having the maximum effective dimensions of 1,220 mm by 1,020 mm and a thickness ranging from 1 to 10 mm. Preferably, the material of the conductive substrate 2 is resistant to electrolytic corrosion and chemicals used in a plating step. Examples of such a material include a stainless-steel plate (e.g., hardened SUS630 as one of the best examples), nickel plate, copper or copper-alloy plate, etc. Dirt and oxide film on the surface of the conductive substrate 2 are removed, and the surface is pretreated for a necessary roughness (Step S1 of FIG. 1). Preferably, the surface of the conductive substrate 2 is ground within a roughness range of 0.08 to 0.23 $\mu$m. The surface roughness of the conductive substrate 2 is set so as to provide an adhesion such that a copper foil 6 can be separated easily in a step (Step S5 of FIG. 1) of separating the copper foil 6 and the conductive substrate 2 from each other, as mentioned later. Thus, the adhesion force at the interface between the conductive substrate 2 and the copper foil 6 is set to be smaller than that at the interface between the copper foil 6 and an insulating substrate 10, as mentioned later.

When using a stainless-steel plate as the conductive substrate 2, the conductive substrate 2 is immersed, for example, in a 80 to 100 ml/l sulfuric acid solution at 60° to 70° C., for 10 to 30 minutes, to be descaled. Then, after rinsing, the substrate 2 is immersed, for removal of smut, in a room-temperature solution of 60 to 100 ml/l nitric acid mixed with acidic solution of 30 g/l ammonium bifluoride, for 10 to 30 minutes. Subsequently, after rinsing, the substrate 2 is subjected to 1 to 2 minutes of cathode-electrolytic degreasing in an electrolytic solution of 20 to 50 g/l sodium phosphate and 50 g/l sodium hydroxide, under the electrolytic conditions of an electrolytic-solution temperature ranging from room temperature to 40° C. and a current value of 3 to 8 A/dm$^2$. Although the surface of the conductive substrate 2 is roughened chemically in the aforesaid roughening step, it may alternatively be roughened mechanically by wet sandblasting (liquid honing) or the like, after it is cleaned chemically.

When using a nickel plate as the conductive substrate 2, the substrate 2 is subjected to 1 to 2 minutes of cathode-electrolytic degreasing in an electrolytic solution of 20 to 50 g/l sodium phosphate mixed with 50 g/l sodium hydroxide, under the electrolytic conditions of an electrolytic-solution temperature ranging from room temperature to 40° C. and a current value of 3 to 8 A/dm$^2$, for example. Then, after rinsing, the substrate 2 is immersed, for surface roughening, in a 1 to 10 g/l hydrogen fluoride solution of 50° C. or a 150 ml/l hydrochloric acid solution of 50° C., for 1 to 10 minutes. Subsequently, after rinsing, the substrate 2 is washed in warm water at 40° to 60° C.

When using a copper or copper-alloy plate as the conductive substrate 2, the substrate 2 is subjected to 30 seconds to 2 minutes of cathode-electrolytic degreasing in an electrolytic solution of 20 to 50 g/l sodium phosphate, under the electrolytic conditions of an electrolytic-solution temperature of 50° to 60° C. and a current value of 3 to 10 A/dm², for example. Then, after rinsing, the substrate 2 is washed in a 1 to 10 g/l hydrogen fluoride of a temperature lower than room temperature, for 30 seconds to 2 minutes, and then in water.

Figure 4:
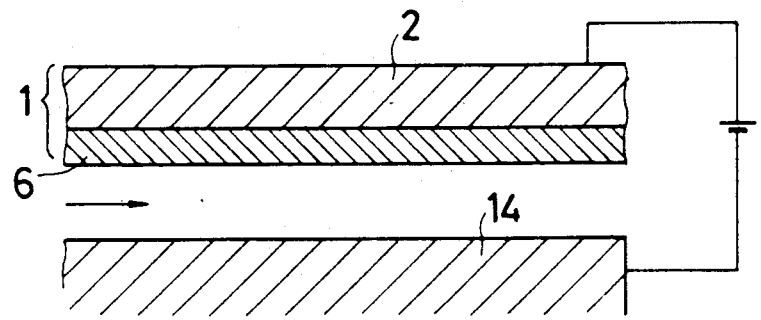
FIG. 4 is a sectional view of the copper-clad laminate in a step (S2) of copper electroforming shown in FIG. 1.

Subsequently, the pre-treated conductive substrate 2, for use as a cathode 1, is opposed to an anode 14 at a predetermined distance (3 to 30 mm) therefrom, and the copper foil 6 is precipitated electrolytically (Step S2 of FIG. 1; FIG. 4) on the conductive substrate 2 by the so-called high-speed plating process. The electrolytic solution used for the high-speed plating may be a copper sulfate plating solution whose metallic copper content ranges from 0.20 to 2.0 mol/l, preferably from 0.35 to 0.98 mol/l, whose sulfuric acid content ranges from 50 to 220 g/l, and whose chlorine ion content ranges from 30 to 800 ppm. To ensure the uniformity of plating, CUPPORAPID Hs (trade name) produced by LPW Co., Ltd., West Germany, is added to the copper sulfate solution at the rate of 1.5 ml/l.

The current density, the flow velocity of the plating solution, and the plating solution temperature are set to 0.15 to 4.0 A/cm², 6.0 to 12.0 m/sec, and 45° to 70° C., preferably 60° to 65° C., respectively. If the plating solution temperature is lower than 45° C., the moving speed of copper ions is lowered, so that polarized layers are liable to be formed on the surfaces of the electrodes. Thus, the plating deposition speed is lowered. If the solution temperature exceeds 70° C., on the other hand, the evaporation loss of the plating solution increases, so that the concentration of the solution becomes unstable. Also, the increase of the solution temperature puts restrictions on equipment.

In the case of the high-speed plating by use of a copper sulfate solution as the solution for copper plating, air is generally used to stir up the solution. With this method, however, the velocity of the plating solution with respect to the cathode is slow, and accordingly concentration-polarized layers are formed near the cathode. Thus, the current density at the time of the electrolysis cannot be set but within the range of 2.5 to 9 A/dm². As a result, the deposited copper obtained by using a copper sulfate solution is liable to have a coarse prismatic crystal structure so that the copper foil obtained has a number of pinholes.

In this connection, the inventors of the present application found that, if the copper sulfate solution is fed forcibly by using, e.g., a pump so that the contact speed of the solution with respect to the cathode may be 6.0 to 12.0 m/sec, copper is deposited as fine copper grains without forming a prismatic crystal structure, and thus it is possible to produce an ultrathin copper foil having a large overall elongation percentage without being lowered in tensile strength and, above all, free of pinholes.

The reason why the aforesaid solution contact speed is effective in avoiding the formation of a prismatic crystal structure of deposited copper is presumably that, since a high solution contact speed is ensured, copper crystal nuclei are formed one after another before a crystal grows from a copper ion which is electroformed on the cathode and serves as a nucleus, thereby restricting the growth of prismatic crystals on the cathode surface. Therefore, when the surface of the electrically conductive substrate does not have the aforesaid structural defects, production of pinholes in the resulting copper foil can be reduced by employing the solution contact speed given above, even if a copper sulfate solution of the aforementioned composition is used as the plating solution.

If the solution contact speed is lower than 6 m/sec, the advantageous effects set forth above are not obtained. On the other hand, increasing the solution contact speed above 12 m/sec results in, for example, an increase of the capacity of a pump for feeding the plating solution, difficulty in sealing the plating apparatus, etc., thus greatly increasing the cost associated with the equipment. Therefore, the upper limit of the solution contact speed should be set to the aforementioned value.

By adjusting the current density and the flow velocity of the plating solution to the aforementioned predetermined conditions, the copper foil 6 is deposited on the surface of the conductive substrate 2 at a deposition speed of 25 to 100 μm per minute. Thus, copper-electroforming can be performed at an efficiency 10 to 200 times as high as that of the conventional plating method, ensuring the manufacture of copper foils with few pinholes at very high productivity. Moreover, deposited copper particles can be made very fine, so that the copper foil 6 can enjoy an elongation percentage of 16 to 25% while maintaining a tensile strength of 35 to 45 kg/cm². This elongation percentage is 1.5 to 2 times the elongation percentage of a copper foil formed by the conventional plating method (or equivalent to that of a rolled annealed copper foil), so that a very soft copper foil can be produced. Thus having a property equivalent to that of a rolled annealed copper foil, the copper foil produced according to the method of the present invention can be used effectively for a flexible substrate which requires high bending capability. Moreover, the surface grains of the produced copper foil 6 can be reduced in average grain size to a very fine level of 1.5 to 3.0 μm. Accordingly, protuberant precipitates formed in the subsequent roughening (electroplating) step can also be made very fine.

When the thickness of the copper foil 6 reaches a predetermined thickness (e.g., 2 to 300 μm), in the copper electroforming step, the electric supply and the supply of the plating solution are stopped. After rinsing, the copper foil 6 is subjected to electroplating for continued roughening (Step S3 of FIG. 1). The electroplating conditions for this electroplating step for roughening includes a current density of 0.25 to 0.85 A/cm², an interelectrode distance of 26 to 50 mm, and a plating solution-contact speed with respect to the electrodes of 0.1 to 0.8 m/sec. The plating solution used, which is not specified in particular, may be a mixed solution of 80 to 150 g/l copper sulfate ($CuSO_4.5H_2O$), 40 to 80 g/l sulfuric acid ($H_2SO_4$), and 25 to 50 g/l potassium nitrate ($KNO_3$), for example.

By this roughening process, protuberant precipitates are electroformed on the surface of the copper foil 6. The average particle size of the protuberant precipitates ranges from 1 to 5 μm, and the adhesion to an insulating substrate 10 mentioned later is improved greatly.

Figure 5:
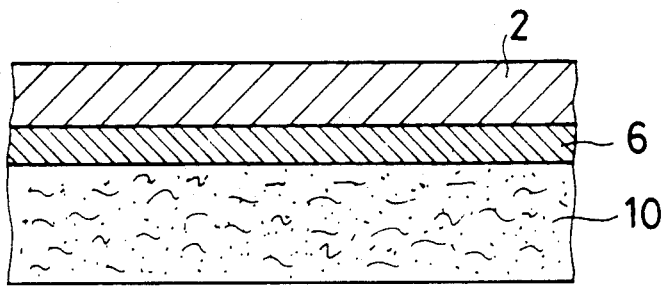
FIG. 5 is a sectional view of the copper-clad laminate in a step (S4) of transfer lamination shown in FIG. 1.

Subsequently, the conductive substrate 2, which is formed with the copper foil 6 in the aforesaid manner, is stacked on the insulating substrate 10 with the interposition of the copper foil 6, and is pressure-bonded thereto with heat (Step S4 of FIG. 1; FIG. 5) by means of a hot press. Both organic and inorganic materials, such as glass, epoxy resin, phenolic resin, polyimide resin, polyester resin, aramid resin, etc., may be used for the insulating substrate 10. Also available are materials which are obtained by enameling the surface of a conductive material, such as iron or aluminum, or by oxidizing the surface of aluminum for alumilite treatment, for insulation. In general, the copper foil 6 is heated and pressurized, and is bonded to a prepreg in a semihardened state (B-stage) which is obtained by impregnating glass cloth or the like with epoxy resin. At this time, the copper foil 6 is adhered and transferred integrally and directly to the insulating substrate 10. Therefore, despite its low physical strength, the copper foil 6 will never be subject to defects in quality, such as wrinkling, cracks, etc.

Figure 6:
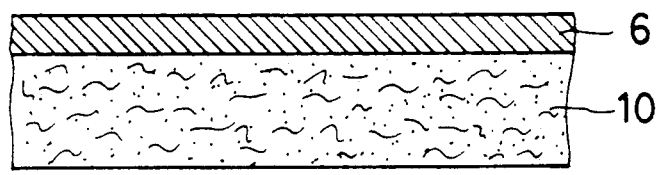
FIG. 6 is a sectional view of the copper-clad laminate in a step (S5, S26) of separating an electrically conductive substrate and metal film shown in FIGS. 1 and 3.

Then, after the insulating substrate 10 is heated and solidified, the conductive substrate 2 is separated (Step S5 of FIG. 1; FIG. 6) from the copper foil 6, which is transferred to the insulating substrate 10. At this time, the force of adhesion between the copper foil 6 and the insulating substrate 10 is greater than that between the conductive substrate 2 and the copper foil 6, so that the conductive substrate 2 is separated from the copper foil 6 at the interface between them, and the copper foil 6 is adhered integrally to the insulating substrate 10.

After completing the steps described above, the surface of the conductive substrate 2, for use as the cathode, is cleaned to remove dirt thereon, i.e., resin of the insulating substrate or adhesive overflowed in the transfer step, and then is polished and activated, whereby the conductive substrate 2 can be repeatedly subjected to the above-described steps.

Figure 7:
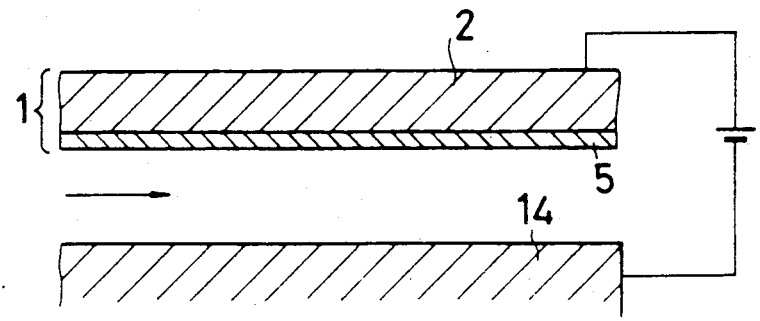
FIG. 7 is a sectional view of the copper-clad laminate in a step (S12, S22) of forming a metal film shown in FIGS. 2 and 3.

Among steps of production according to another embodiment of the present invention, a step of forming a metal film 5 on the surface of the planar conductive substrate 2 is added after the end of a pretreatment (Step S11 of FIG. 2) of the conductive substrate 2. Also in this case, the conductive substrate 2, for use as the cathode 1, is opposed to the anode 14 at a predetermined distance (6 to 30 mm) therefrom, and the metal film 5 is electrolytically precipitated (Step S12 of FIG. 2; FIG. 7) on the conductive substrate 2 by high-speed plating in the same manner as aforesaid. Copper or nickel may be suitably used as a material for the metal film 5, which is deposited to a thickness of 0.1 to 3 $\mu$m on the surface of the conductive substrate 2.

Precipitation of copper as the metal film 5 requires high-speed plating conditions such that the cathode is rotated, or the plating solution is supplied forcibly between fixed electrodes, so that a plating solution of 45° to 70° C. causes a turbulent flow on the surface of the cathode, that is, an interelectrode distance of 3 to 30 mm and an electrode-solution contact speed of 6.0 to 12.0 m/sec are obtained. Preferably, in this case, a copper sulfate plating solution, for example, is used as the plating solution, an electric current with a current density of 0.15 to 4.0 A/cm$^2$ is applied, and the deposition speed of the metal film 5 is set to 25 to 100 $\mu$m/min.

Precipitation of nickel as the metal film 5 requires high-speed plating conditions such that the the cathode and the anode are spaced at a distance of 300 to 350 mm from each other, and an electrolytic solution of 40° to 48° C. is supplied between these electrodes for air stirring. Preferably, in this case, nickel sulfate or nickel sulfamate, for example, is used for the plating solution, a current with a current density of 2.2 to 4.0 A/cm$^2$ is applied, and the deposition speed of the metal film 5 is set to 0.8 to 1.5 $\mu$m/min.

Also, a nickel-phosphorus alloy may be used for the metal film 5. Preferably, in this case, electroless nickel plating is performed under the condition that a plating solution of 35° to 40° C. is oscillated so that the solution contact speed at the surface of the conductive substrate 2 is 40 to 80 mm/sec. Preferably, in this case, an electroless nickel solution, containing hypophosphorous acid or boron-based reducing agent, or the like is used as the plating solution, and the deposition speed of the metal film 5 is set to 1 to 3 $\mu$m per 30 minutes.

Thus, the metal film 5 is electroformed by high-speed plating on the conductive substrate 2 which has the required surface roughness as aforesaid. Therefore, the metal film 5 is adhered to the conductive substrate 2 with a proper force. Further, its surface roughness is within a range suitable for obtaining a desired adhesion force between the copper foil 6 and the metal film 5 mentioned later, by high-speed plating under the aforementioned plating conditions. In other words, according to this embodiment, the surface roughness of the metal film 5 can be controlled suitably by combining the individual conditions including the surface roughness of the conductive substrate 2, the solution contact speed of the plating solution, and the current density. Thus, according to this embodiment, the surface of the metal film 5, deposited by the high-speed plating, does not require any special surface treatment after the plating.

Moreover, the conductive substrate 2 made of a stainless-steel or nickel plate is subject to electrochemical defects. These defects include intermetallic compounds, nonmetallic inclusions, segregations, pores, etc. These defects are produced during the manufacture of the stainless-steel plate by fusion etc., and cannot be removed by only treating, e.g., polishing, the surface of the conductive substrate 2. Such defects would cause pinholes in the copper foil 6.

The surface of the metal film 5, which is formed on the surface of the conductive substrate 2, is electrochemically smooth, and accordingly the production of cracks, wrinkles, or pinholes in the copper foil 6, which is low in physical strength and very thin with a thickness of 10 $\mu$m or less, can be prevented by forming the copper foil 6 on the metal film 5, as mentioned later.

Figure 8:
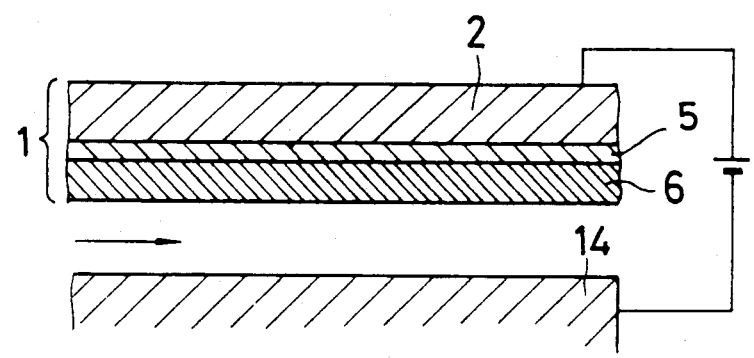
FIG. 8 is a sectional view of the copper-clad laminate in a step (S13, S23) of copper electroforming shown in FIGS. 2 and 3.
Figure 9:
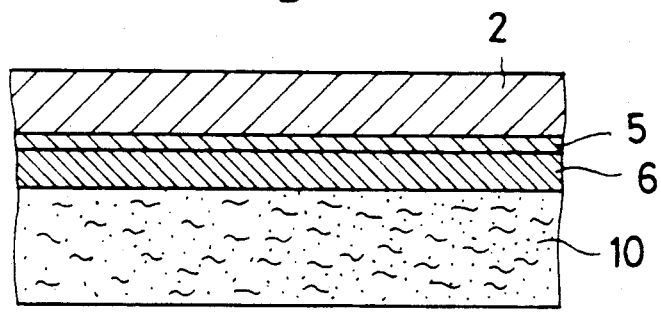
FIG. 9 is a sectional view of the copper-clad laminate in a step (S15, S25) of transfer lamination shown in FIGS. 2 and 3.
Figure 10:
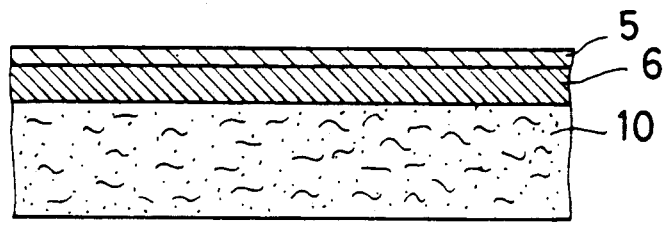
FIG. 10 is a sectional view of the copper-clad laminate in a step (S16) of separating an electrically conductive substrate shown in FIG. 2.

Subsequently, the copper foil 6 is formed (Step S13 of FIG. 2; FIG. 8) on the metal film 5 in the same manner as in the above described step of the present invention, and the surface of the copper foil 6 is roughened (Step S14 of FIG. 2). Thereafter, the conductive substrate 2, formed with the copper foil 6 with the interposition of the metal film 5, is put on the insulating substrate 10 for lamination, and is pressure-bonded thereto with heat (Step S15 of FIG. 2; FIG. 9) by means of a hot press. The aforementioned materials may be used for the insulating substrate 10. After the copper foil 6 and the insulating substrate 10 are firmly adhered to each other, only the conductive substrate 2 is removed (Step S16 of FIG. 2; FIG. 10). The force of adhesion between the conductive substrate 2 and the metal film 5 is smaller than those between the metal film 5 and the copper foil 6 and between the copper foil 6 and the insulating substrate 10, whereby only the conductive substrate 2 can be removed. Thus, as shown in FIG. 10, the metal film 5 and the copper foil 6 are transferred in a body to the insulating substrate 10.

In the transfer step described above, if the metal film 5 and the copper foil 6 are made of the same metal, i.e., copper, the metal film 5 need not be removed after the transfer, and it is necessary only that the total thickness of the two layers be adjusted to a desired thickness in advance. If the metal film 5 is made of nickel or some other metal different from the material of the copper foil 6, it must be removed (Step S17 of FIG. 2; FIG. 6) by etching using an acid, for example, after the transfer.

Also in this case, after completion of these steps of production, the surface of the conductive substrate 2 is cleaned to remove dirt thereon and then polished and activated, so that the conductive substrate 2 can be repeatedly subjected to the steps.

Figure 3:
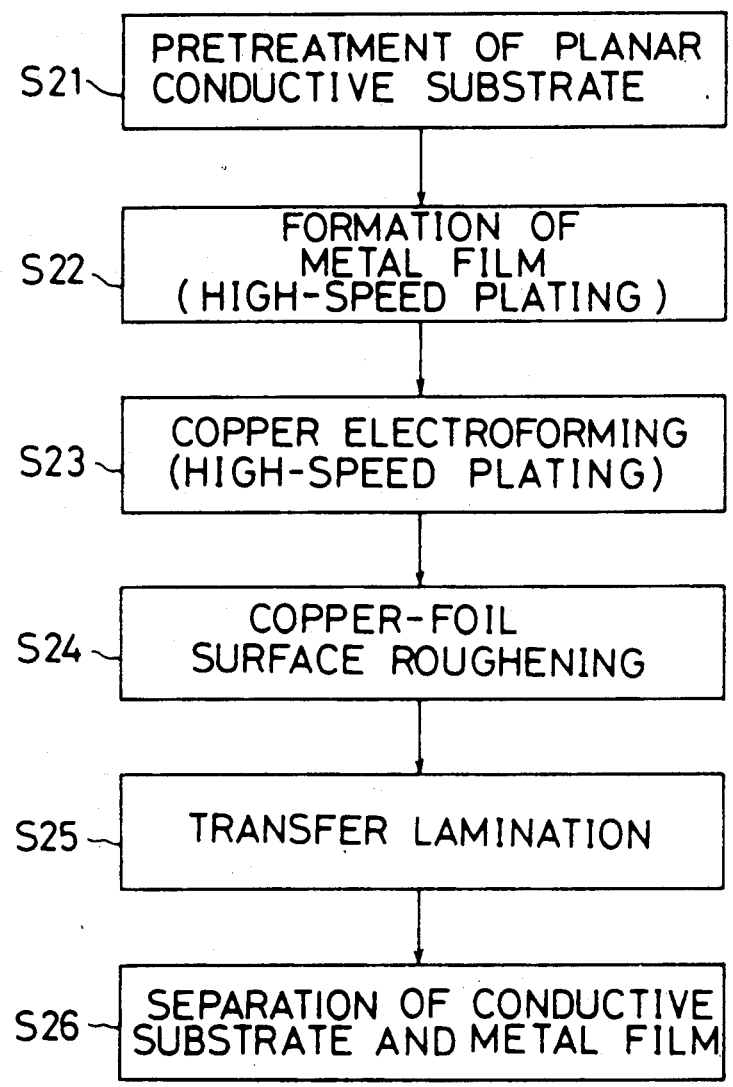
FIG. 3 is a process flow chart for illustrating further preferred manufacturing steps of the process for producing a copper-clad laminate according to the present invention.

Among steps of production according to still another embodiment of the present invention, the steps including the pretreatment of the planar conductive substrate (Step S21 of FIG. 3), formation of the metal film (Step S22 of FIG. 3; FIG. 7), copper electroforming (Step S23 of FIG. 3; FIG. 8), copper foil surface roughening (Step S24 of FIG. 3), and transfer lamination (Step S25 of FIG. 3; FIG. 9) are the same as the aforementioned steps of production according to the second embodiment. In this third embodiment, however, the thickness of the metal film 5 is set to 70 to 250 μm. In this embodiment, moreover, the metal film is separated from the copper foil after the transfer lamination, and is left on the conductive substrate, as mentioned later. Therefore, the surface roughness of the metal film 5 must be set so that the force of adhesion between the metal film 5 and the copper foil 6 is smaller than those between the metal film 5 and the conductive substrate 2 and between the copper foil 6 and the insulating substrate 10.

After the end of the step of transfer lamination shown in FIG. 9, the conductive substrate 2 and the metal film 5 are separated together at the interface with the copper foil 6, so that only the copper foil 6 is left adhering to the insulating substrate 10. After the separation of the copper foil 6, the metal film 5 remains on the surface of the insulating substrate 10. The surface of the metal film 5 is polished as required, and the copper foil 6 is formed again on the metal film 5 so that the substrate can be repeatedly subjected to the aforesaid steps. Alternatively, after the metal film 5 is removed, the surface of the insulating substrate 10 is polished, and the metal film 5 and the copper foil 6 are formed successively on the insulating substrate 10, whereby the aforesaid steps can be repeated.

In this embodiment, a plate obtained by rolling an ingot of stainless steel, nickel, copper or the like is preferably used as the planar conductive substrate, and a layer of a nickel-cobalt alloy containing 60% to 80% nickel and 20% to 40% cobalt, both by weight, is preferably electroformed on the surface of the plate to a thickness of 70 to 250 μm, as the metal film 5.

The nickel-cobalt alloy plating layer has a Vickers hardness of 450 to 540, which is equivalent to or greater than that of hardened steel such as SUS630 mentioned above, and thus serves to prevent the surface of the conductive substrate from being deformed by heat and pressure in the transfer lamination step. It is therefore unnecessary to use a super hard plate, e.g., SUS630 which is expensive, as the conductive substrate. For example, the aforesaid nickel-cobalt alloy layer may be formed on a stainless steel plate such as SUS304, then the plate obtained can enjoy a surface hardness equivalent to or greater than that of SUS630. Thus, the cost can be cut to half or less without degrading the characteristics of the substrate.

Moreover, the alloy plating layer serves to prevent pinholes from being produced in the copper foil due to nonmetallic inclusions, intermetallic compounds, pores such as oil pits, etc., which are produced internally in the fusion-to-rolling process for producing the conductive substrate. This effect of the alloy plated layer is effective when the thickness of the layer is greater than 70 μm. If, however, the thickness of the plated layer is too great, an electroforming stress is accumulated in the plated layer being formed, causing peeling of the conductive substrate 2, warping or twisting of the plated layer together with the conductive substrate. For this reason, the upper limit is defined for the thickness of the plated layer, i.e., 250 μm as mentioned above.

To form the nickel-cobalt alloy layer, the surface of the conductive substrate (one or both surfaces thereof) is ground to eliminate defects therein and to obtain a surface roughness of 0.35 to 0.45 μm on the average. Subsequently, the ground surface of the substrate is polished randomly and uniformly by wet sandblasting using 320# emery, for example, to obtain a surface roughness of 0.25 to 0.28 μm on the average. Then, the nickel-cobalt alloy layer of the above-mentioned composition is formed on the polished surface to the thickness of 70 to 250 μm, such that the electroforming stress may be small.

The obtained plated layer has a glossy, or almost specular surface. This surface is intentionally roughened by a wet grinding machine to obtain a surface roughness of 0.05 to 0.08 μm. This is done because, if the subsequent step of forming a copper foil at high deposition speed is carried out without roughening the specular surface, undesirably early peeling of the deposited copper will occur, that is, part of the deposited copper will be peeled off too early by the high-speed flow of the plating solution or other external forces such as vibrations. The specular surface is roughened to eliminate such situation.

By forming the nickel-cobalt alloy layer, the conductive substrate can retain high hardness even after the copper foil is separated, and its surface suffers few damages, and thus the substrate can be used repeatedly for a long time.

If a chrome plating layer of 0.05 to 3 μm thick is further formed on the nickel-cobalt alloy layer mentioned above, then the surface of the substrate can enjoy an increased Vickers hardness of more than 500. The interface tension of chrome is several tens of times that of the nickel-cobalt alloy or copper, and accordingly the separability of the substrate from the copper foil is greatly improved, and the conductive substrate can be repeatedly used semi-permanently by only removing dirt etc. at the time of the transfer lamination, without the need for polishing the substrate.

By plating the above-mentioned alloy layer on the surface of the conductive substrate, moreover, generation of defects of the conductive substrate, such as nonmetallic inclusions, oil pits, etc., can be prevented, and such defects can be covered over by the alloy layer. Further, the plated layer permits easy repair when part thereof is damaged. In any case, the alloy layer is effective in preventing the formation of pinholes.

Now, apparatuses used for the process of the present invention will be described. In such apparatuses, the positions of the cathode and anode, and the shape and dimensions of an exhaust port with respect to a plating cell to which the plating solution is supplied have a great influence on the plating conditions and the properties of the deposited copper.

For example, in the case of a horizontal cell and in which the cathode is positioned on the lower side (the anode on the upper side), when the plating process and the supply of the plating solution are stopped and then the cathode or anode is moved downward or upward to allow the conductive substrate, on which copper has been electrodeposited, to be extracted easily, the gap between the electrodes of the cell is increased. At this time, the plating solution is more or less left in the gap between the electrodes. Therefore, since the cathode is located on the lower side, the copper foil deposited on the surface of the conductive substrate contacts the residual plating solution and is partly dissolved thereby.

This dissolution and corrosion of the copper foil can be caused in a short time by oxygen in a nascent state, generated during the plating and contained in the solution, so that the uniformly formed copper foil is damaged shortly. As a result, nodular surfaces or pinholes are produced. It is therefore essential to position the cathode on the upper side and the anode on the lower side, in other words, the construction should be such that the plating solution containing oxygen in a nascent state never contacts the copper foil until the foil is extracted after the end of the plating process. If the cathode is located on the lower side, moreover, the plating solution may contact an electrically conductive portion connected to the cathode when the conductive substrate is extracted from the cell. The conductive portion is 70° to 90° C. in temperature, as heated by the plating solution and the heat generated in the plating process. Accordingly, the plating solution may be evaporated, leaving fine crystals of copper sulfate on the conductive portion. The copper sulfate crystals thus produced will not only hinder proper adhesion between the conductive substrate and the conductive portion, but also possibly damage the surface of the conductive portion when the plating is restarted with a new conductive substrate set at the conductive portion.

A fundamental principle of the high-speed plating using a copper sulfate plating solution is that the plating solution is supplied to the cell at high speed so as to produce a turbulent flow within the cell. If the cell is designed such that an inlet port and exhaust port thereof have the same volume (that is, their gaps have the same dimensions), the turbulence disappears in the vicinity of the exhaust port and thus a copper film with pinholes or a dendritic copper film will be formed.

For these reasons, the distance between the exhaust side end of the cell and the outlet and the gap of the exhaust port are both set to a value three to five times the distance between the cells. Also, the solution contact speed is set to 6.0 m/sec or more to enable a turbulent flow to be continuously maintained at the exhaust port side as well. The setting of the gap of the exhaust port is of great importance equally for the horizontal and vertical plating apparatuses especially when copper-clad laminates are to be produced by using a 300×300 mm conductive substrate. No problem, however, arises when using a rotary plating apparatus because its exhaust port is arranged in the circumferential direction.

Figure 11:
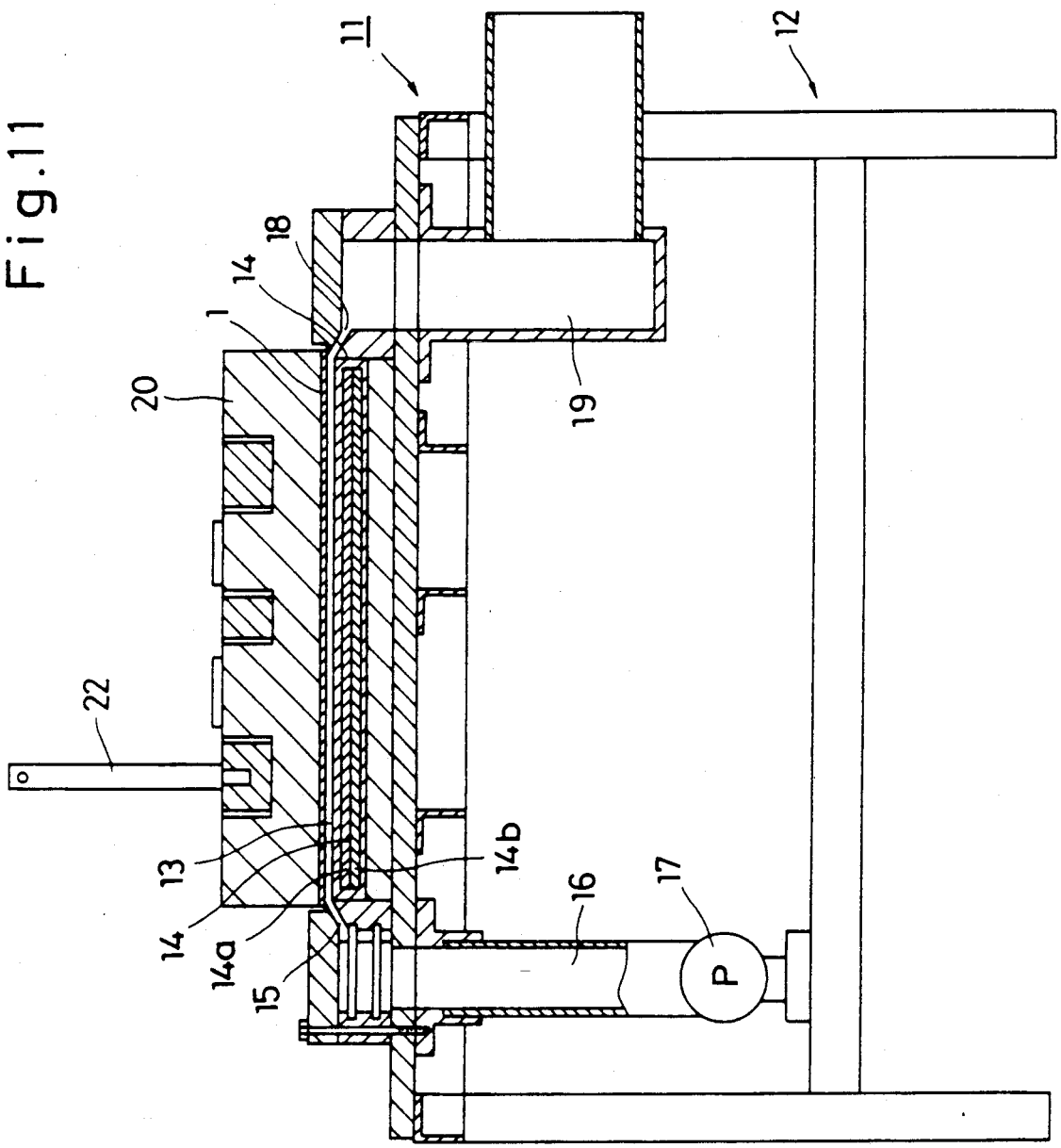
FIG. 11 is a front sectional view showing an arragement of a high-speed plating apparatus of a horizontal type.
Figure 12:
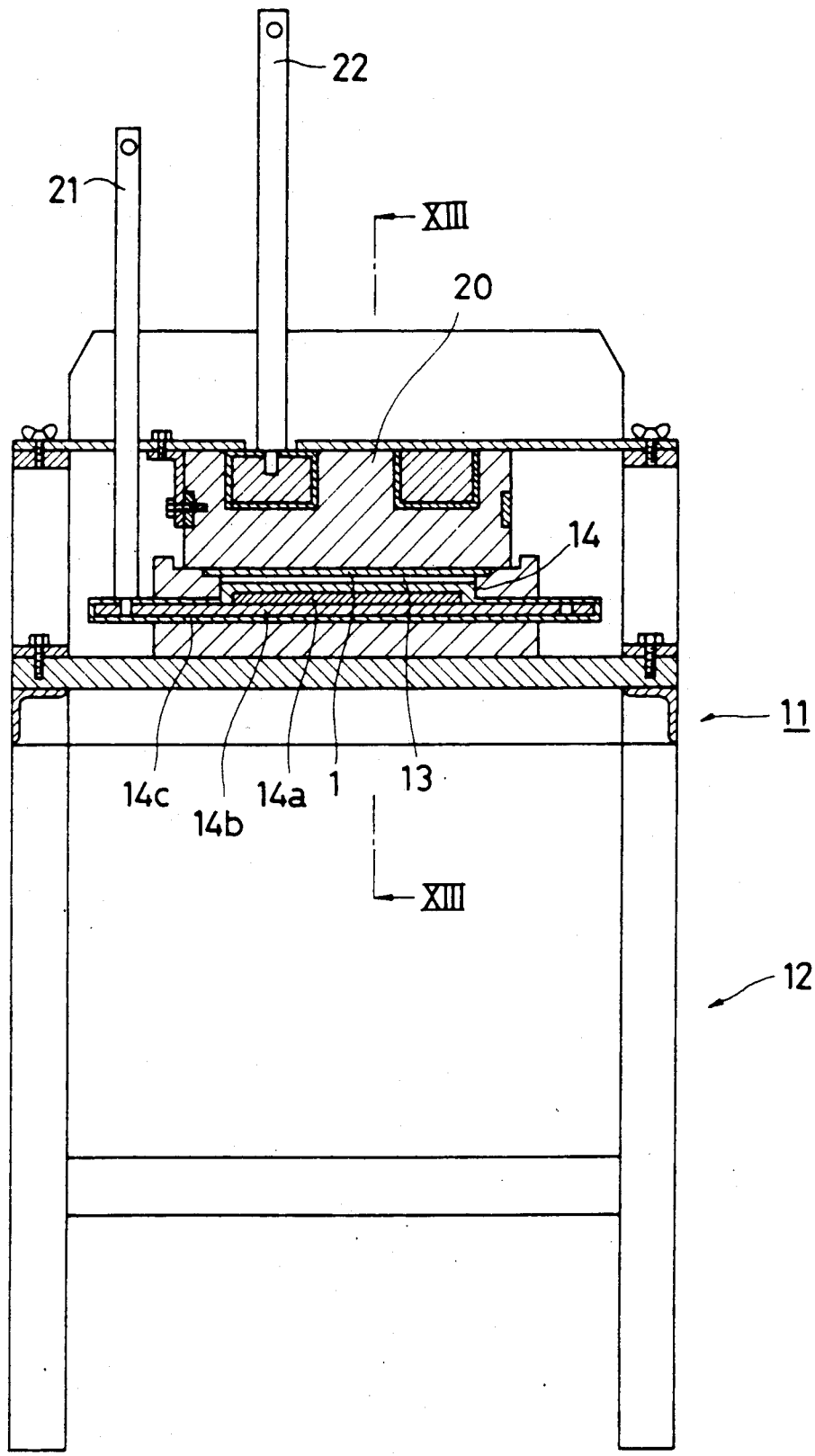
FIG. 12 is a side view of the high-speed plating apparatus of FIG. 11.
Figure 13:
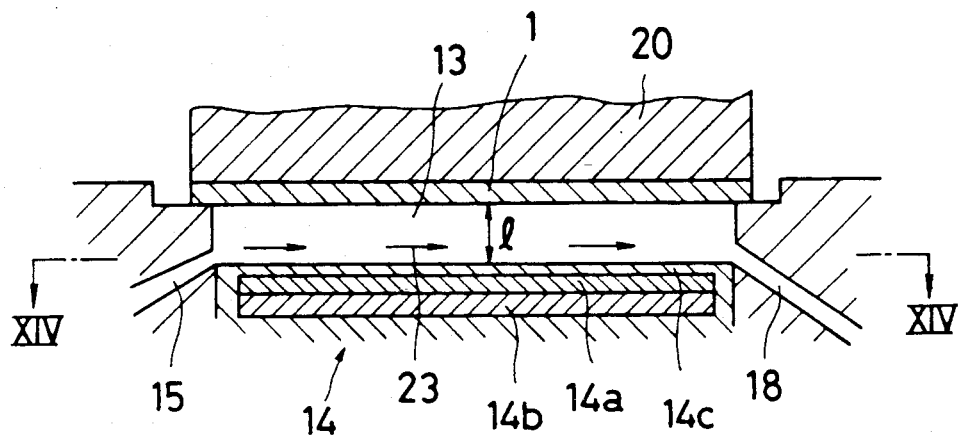
FIG. 13 is a sectional view taken along line XIII—XIII of FIG. 12.

FIGS. 11 to 14 show an example of the horizontal plating apparatus for effecting high-speed plating in Step S2 of FIG. 1. The planar insoluble anode 14 is set horizontally in the center of the top portion of the frame 12 of the plating apparatus 11, and the cathode 1 is fixed in a facing relation to the anode 14 so as to extend parallel thereto. As shown in FIGS. 11 to 13, the insoluble anode 14 includes two copper plates 14a and 14b superposed one on the other in order to permit a large current flow. A lead coating 14c is deposited uniformly to a thickness within a range of 2 to 10 mm, preferably 3 to 7 mm, over the whole surfaces of the copper plates 14a and 14b, by means of an acetylene torch or the like. Usually, a lead alloy containing 93% lead and 7% tin is used for the lead coating 14c. If the interelectrode distance is subject to an irregularity of 100 μm, an electroformed copper film of 35- μm thickness is subject to a variation of several microns. When applying a high-current density (0.8 to 1.2 A/cm$^2$) for a long time (1,000 hours or more), the variation of the film thickness increases due to partial electrolytic dissipation of the electrode. Therefore, the interelectrode distance must be maintained by reprocessing the electrode. Instead of using the electrode coated with lead, the insoluble anode 14 may be formed by uniformly applying a pasty mixture of thermopolymerizable resin and impalpable powder of platinum or palladium to the surface of a titanium plate with a roughened surface, and then baking the coated plate at 700° to 800° C. With use of such a titanium-plate anode, electrolytic dissipation is reduced considerably, and the electrode need not be reprocessed even after prolonged use (for 1,000 hours or more).

Figure 2:
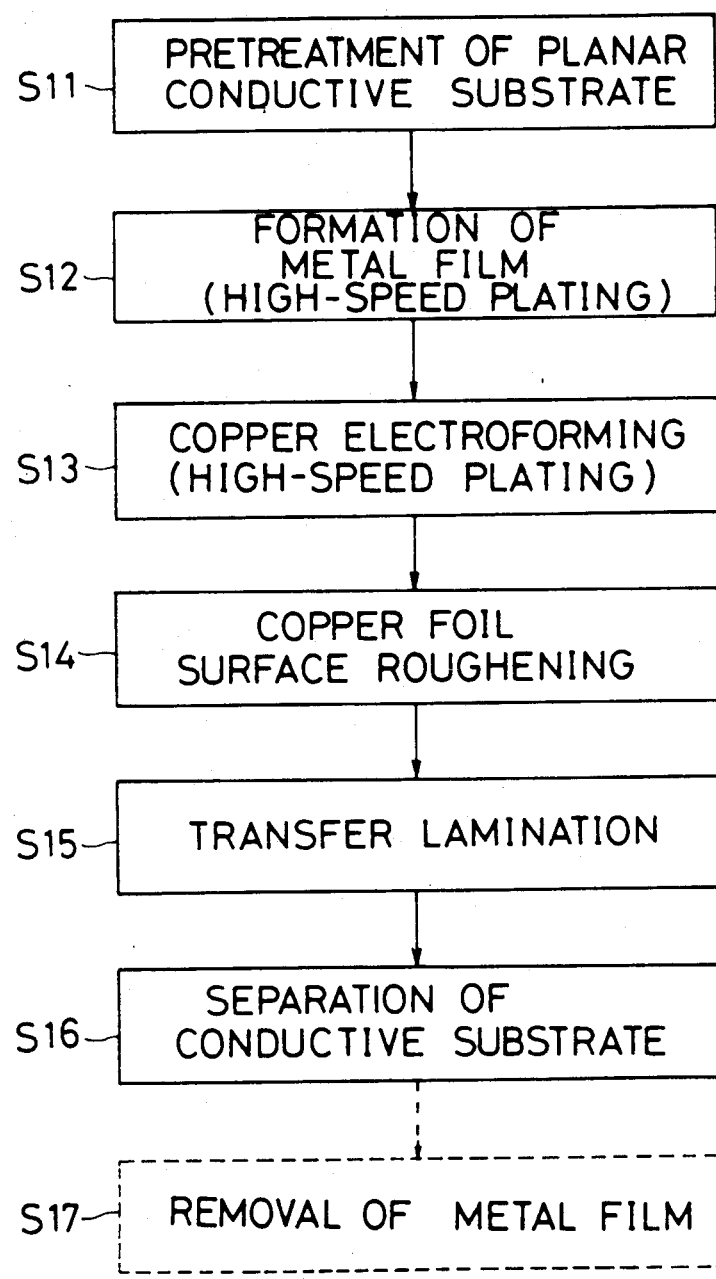
FIG. 2 is a process flow chart for illustrating alternative manufacturing steps of a process for producing a copper-clad laminate according to the present invention.

The cathode 1 is fixedly mounted so that the polished surface of the conductive substrate 2 faces the anode 14 in the step of forming the metal film, or Step S12 of FIG. 2 or Step S22 of FIG. 3, and that the surface of the conductive substrate 2 formed with the metal film 5 faces the anode 14 in the step of electroforming the copper foil or Step S2 of FIG. 1. The distance between the cathode 1 and the insoluble anode 14 is adjusted to values best suited for the step of forming the metal film 5 and the step of electroforming the copper foil 6, respectively.

One end of a nozzle 15, which serves to feed the plating solution 23 at high speed, is connected to the inlet side of a cavity portion 13 between the cathode 1 and the insoluble anode 14. At the inlet portion of the cavity portion 13, the nozzle 15 opens so as to cover the substantially overall width of the insoluble anode 14, as shown in FIG. 12. The other end of the nozzle 15 is connected to a pump 17 by a duct 16. Further, the pump 17 is connected to a plating solution tank (not shown) by means of another duct (not shown). On the outlet side of the cavity portion 13 (on the opposite side of the insoluble anode 14 to the location of the nozzle 15), an exhaust port 18 opens so as to cover the substantially overall width of the insoluble anode 14. The exhaust port 18 is connected to the plating solution tank by a duct 19. The cross-sectional shapes of the nozzle 15 and the exhaust port 18, with respect to the direction of the solution flow, vary smoothly so that the plating solution 23 can flow with a uniform speed distribution, in the cavity portion 13. The plating solution 23 discharged from the pump 17 is returned to the plating solution tank successively through the duct 16, the nozzle 15, the cavity portion 13 between the cathode 1 and the insoluble anode 14, the exhaust port 18, and the duct 19. Thereafter, the plating solution 23 is circulated continuously through the aforesaid route by the pump 17.

When the plating solution 23 is fed from the nozzle 15 to the interelectrode cavity portion 13 at the aforementioned suitable plating speed, the flow of the plating solution is disturbed in the vicinity of the surface of the cathode 1. Thus, the plating film can be developed at high speed by suppressing the growth of a polarized layer in order to prevent the metallic-ion concentration in the vicinity of the surface of the electrode from lowering extremely.

In the plating step according to the present invention, the aforesaid required high current is fed between the cathode 1 and the insoluble anode 14 through the medium of a feeder plate 20 having high electrical conductivity and chemical resistance to copper, graphite, lead, etc., an anode power supply cable 21, and a cathode power supply cable 22. Thus, the copper film can be electrolytically precipitated, at a deposition speed of about 25 to 100 μm per minute, on that surface of the cathode 1 facing the insoluble anode 14.

Figure 14:
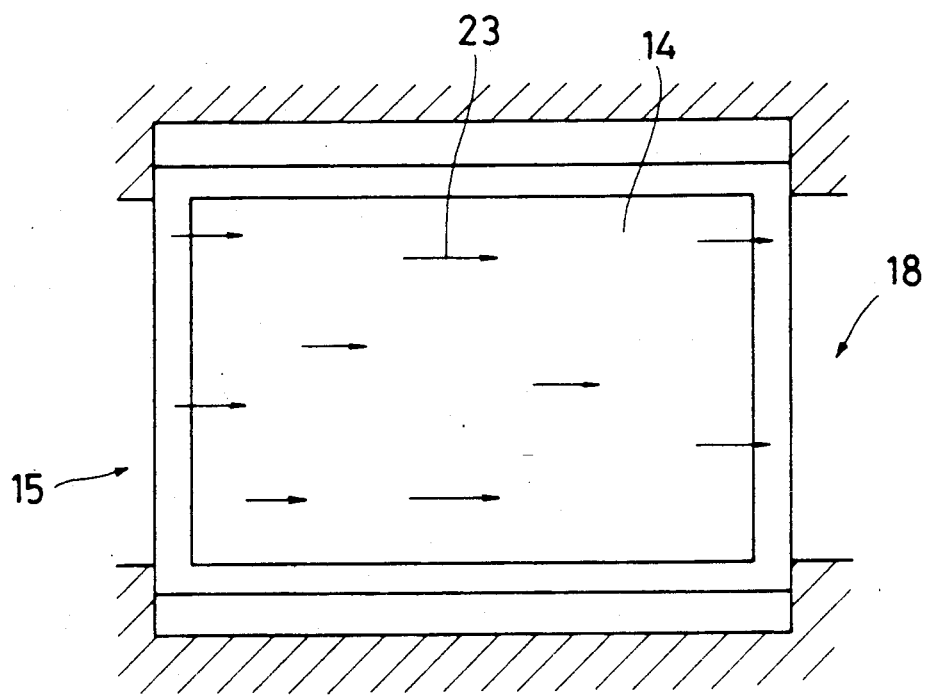
FIG. 14 is a sectional view taken along line XIV—XIV of FIG. 13.
Figure 15:
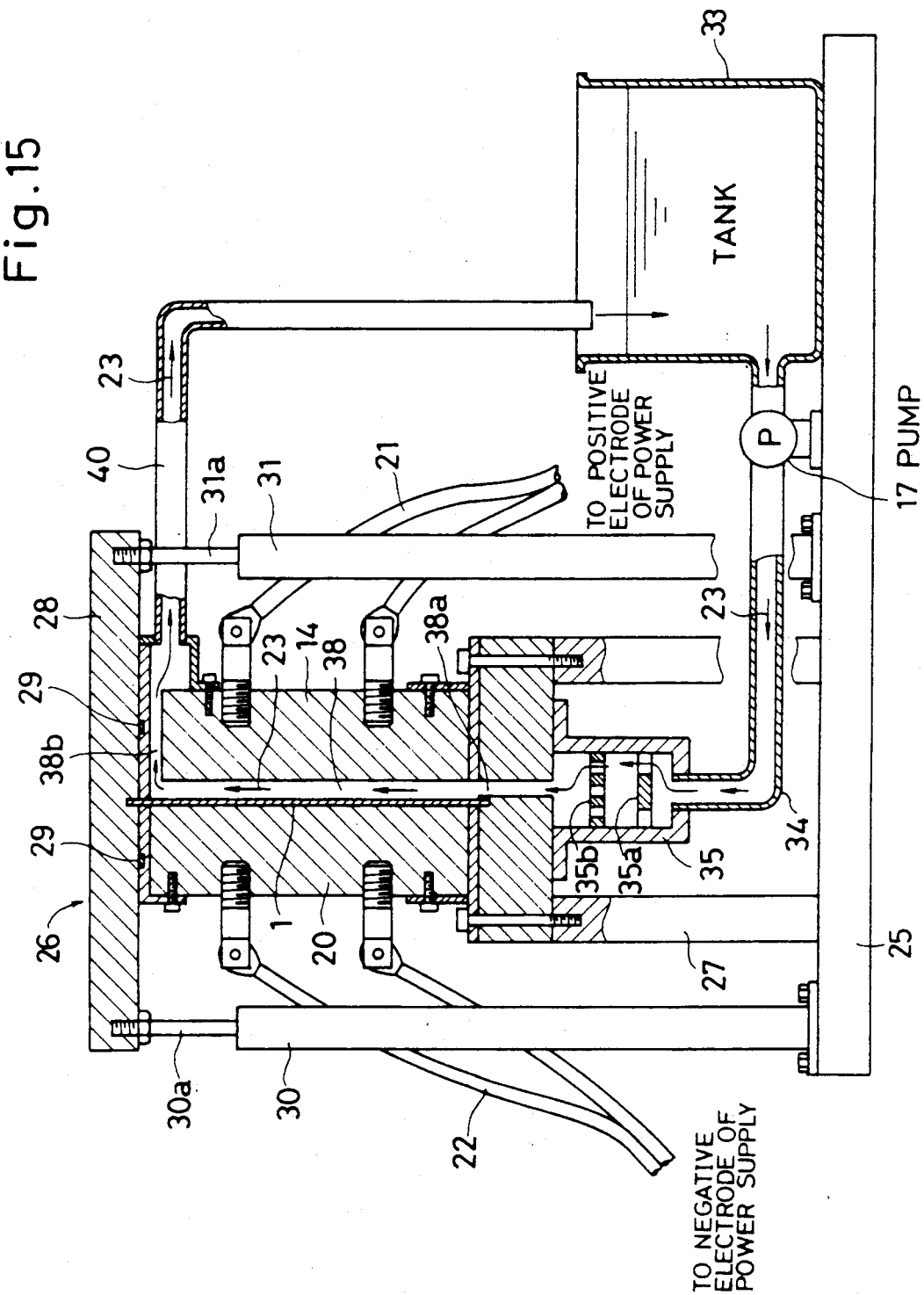
FIG. 15 is a front sectional view showing an arrangement of a high-speed plating apparatus of a vertical type.

FIG. 15 shows a vertical plating apparatus for effecting the process of the present invention. Whereas the cathode 1 and the anode 14 in the plating apparatus 11 shown in FIGS. 11 to 14 are arranged horizontally, the plating apparatus 25 shown in FIG. 15 differs from the apparatus 11 in that its cathode 1 and insoluble anode 14 are arranged vertically. In FIG. 15, like reference numerals are used to designate like portions having substantially the same functions as their counterparts in the plating apparatus 11 shown in FIGS. 11 to 14. A detailed description of those portions is omitted herein (and the same will apply hereinafter).

The plating apparatus 25 comprises a stand 27 fixed on a base plate 26, posts 30 and 31 (only two posts are shown in FIG. 15) arranged at the four corners of a quadrilateral, a top plate 28 horizontally supported by telescopic rods 30a and 31a, and a highly conductive feeder plate 20 and the insoluble anode 14 fixed between the top surface of the stand 27 and the undersurface of the top plate 28 so as to face each other, and extending vertically and parallel to each other. The feeder plate 20 and the anode 14 are spaced at a predetermined interelectrode distance. Like the anode shown in FIGS. 9 to 11, the insoluble anode 14 is formed of a titanium plate coated with impalpable powder of platinum or the like, which permits a large current flow.

The cathode 1 is fixedly mounted by a vacuum chuck (not shown) or the like so that the polished surface of the conductive substrate 2, polished in Step S11 in FIG. 2, faces the feeder plate 20 in the step of forming the metal film or step S12 in FIG. 2, and that the surface of the conductive substrate 2 formed with the metal film 5 faces the feeder plate 20 in the step of electroforming the copper foil or step S2 in FIG. 1. In mounting the cathode 1, the top plate 28 is moved up, and the cathode 1 is inserted along that surface of the feeder plate 20 on the side of the anode 14, and is fixed by the vacuum chuck or the like. Thereafter, the top plate 28 is lowered again to be adhered to the respective top walls of the anode 14 and the feeder plate 20. Thus, the mounting of the cathode 1 is completed. In FIG. 15, numeral 29 denotes an O-ring for sealing. The distance between the cathode 1 and the insoluble anode 14 is adjusted to values best suited for the step of forming the metal layer 5 and the step of electroforming the copper foil 6, respectively.

A ramp portion 38a, into which the plating solution 23 flows at high speed, is formed on the inlet side of a cavity portion 38 between the cathode 1 and the insoluble anode 14. At the inlet portion of the cavity portion 38, the ramp portion 38a opens so as to cover the substantially overall width of the insoluble anode 14, in the same manner as shown in FIG. 14. The opposite side of the ramp portion 38a to the cavity portion 38 is connected to a pump 17 by a rectifying unit 35 and a duct 34. Further, the pump 17 is connected to a plating solution tank 33. On the outlet side of the cavity portion 38 (on that side of the cavity portion 38 at the upper portion thereof for the discharge of the plating solution 23), an exhaust port 38b opens so as to cover the substantially overall width of the insoluble anode 14. The exhaust port 18 is connected to the plating solution tank 33 by a duct 40.

The internal space of the rectifying unit 35 is divided into small chambers by two rectifying plates 35a and 35b which, each having a number of perforations, are arranged in the flowing direction of the plating solution 23. The rectifying plates 35a and 35b serve to rectify the flow of the plating solution 23 flowing into the ramp portion 38a and thus to equalize the speed distribution of the plating solution 23 flowing upward through the cavity portion 38. The plating solution 23 discharged from the pump 17 is returned to the plating solution tank 33 successively through the duct 34, the rectifying unit 35, the ramp portion 38a, the cavity portion 38 between the cathode 1 and the insoluble anode 14, the exhaust port 38b, and the duct 40. Thereafter, the plating solution 23 is circulated continuously through the aforesaid route by the pump 17.

The plating apparatus 25 shown in FIG. 15 feeds the plating solution 23 further upward to the interelectrode cavity portion 13 through the rectifying unit 35. Therefore, the plating solution 23 in the cavity portion 13 has a turbulence speed distribution more uniform than that of the plating apparatus 11 shown in FIG. 11. Such a situation is well suited for the electroforming of copper foil of a uniform thickness.

Also in the plating apparatus shown in FIG. 15, the aforesaid required high current is fed between the cathode 1 and the insoluble anode 14 through the medium of a feeder plate 20 having high electrical conductivity and chemical resistance to copper, graphite, lead, etc., an anode power supply cable 21, and a cathode power supply cable 22. Thus, the copper film can be electrolytically precipitated, at a deposition speed of about 25 to 100 μm per minute, on that surface of the cathode 1 facing the insoluble anode 14.

Figure 16:
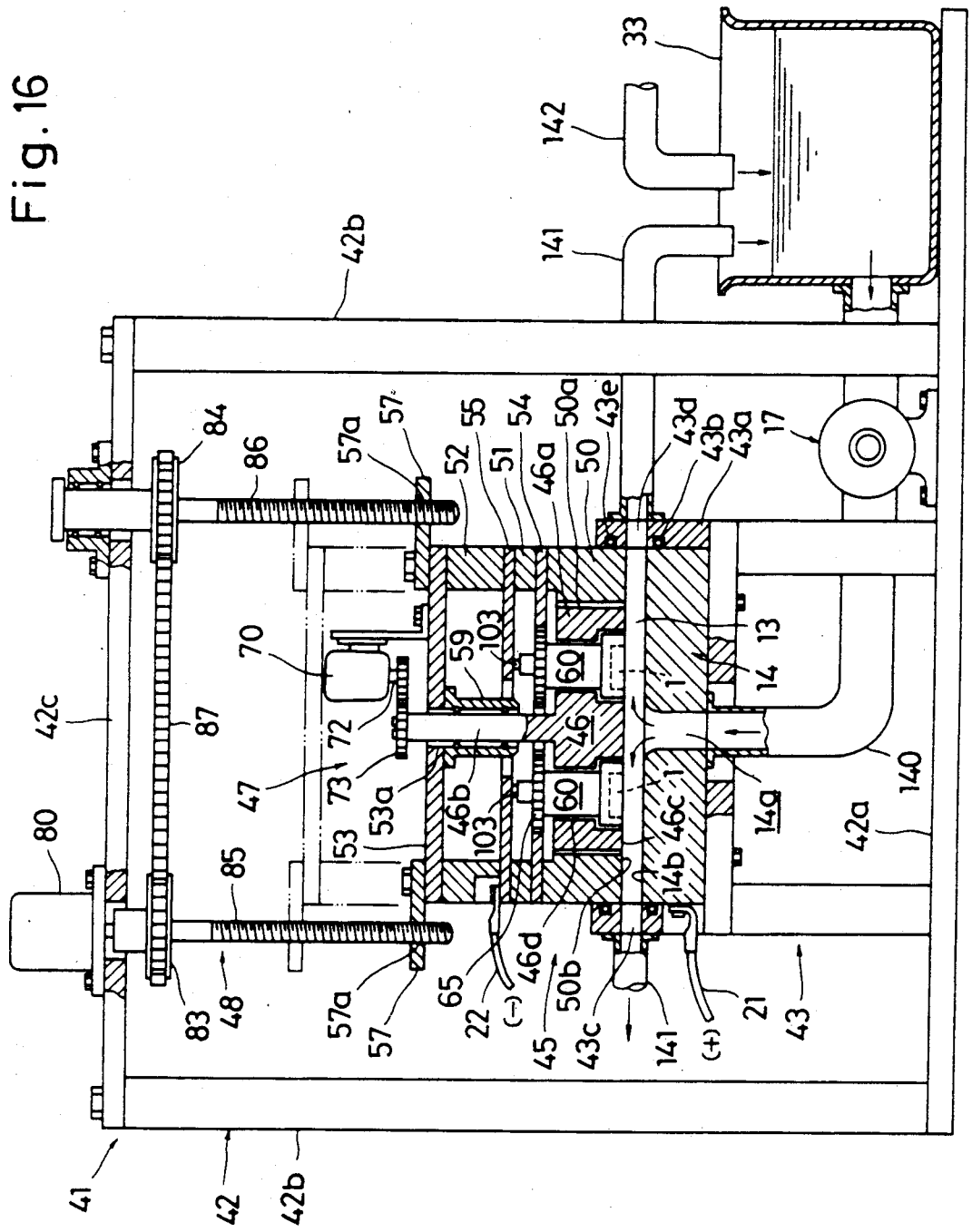
FIG. 16 is a cutaway front view showing an arrangement of a high-speed plating apparatus of a rotary type.
Figure 17:
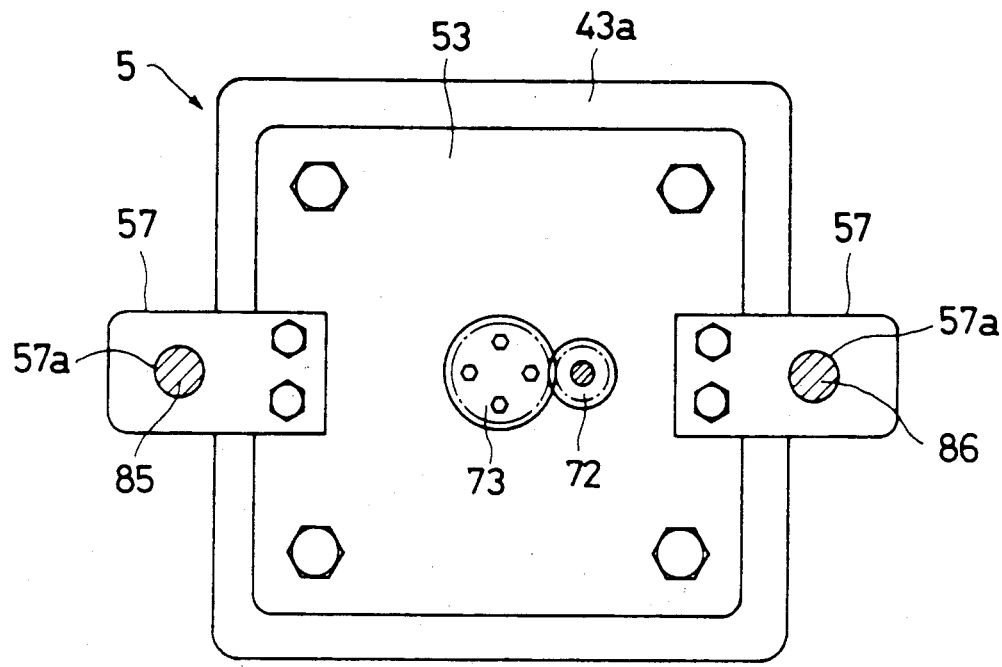
FIG. 17 is a top view of a housing shown in FIG. 16.
Figure 18:
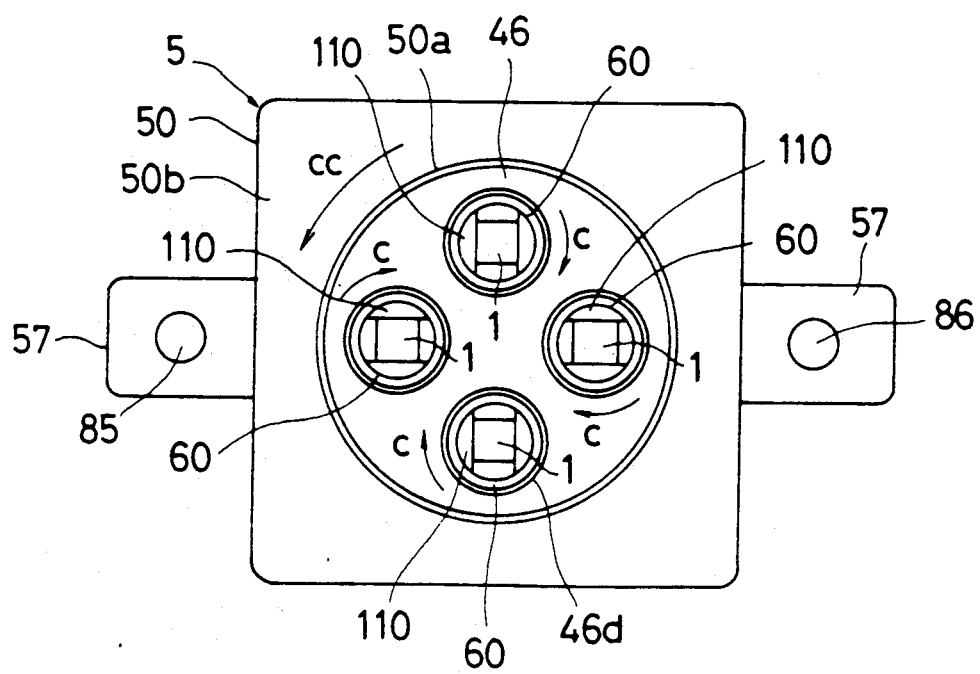
FIG. 18 is a bottom view of the housing shown in FIG. 16.

FIGS. 16 to 18 show a rotary high-speed plating apparatus 41 for effecting the process of the present invention. The plating apparatus 41 comprises a frame 42, a stand 43 disposed inside the frame 42 and bearing the insoluble anode 14 thereon, a housing 45 located above the anode 14, a rotating body 46 rotatably contained in the housing 45 and adapted to hold the cathodes 1, and a drive mechanism 47 for driving the rotating body 46. The apparatus 41 further comprises a drive mechanism 48 disposed at the upper portion of the frame 42 and adapted to raise and lower the housing 45, a plating solution tank 33 storing the plating solution, and a pump 17 for feeding the plating solution in the plating solution tank 33 into a liquid-tight cavity portion 13 defined between the respective opposite end faces of the anode 14 and the rotating body 46.

The frame 42 includes four posts 42b, 42b (only two of them are shown) set up on a base plate 42a, and a top plate 42c fixed on the respective upper end faces of the posts 42b, 42b.

The stand 43 is mounted on the base plate 42a so as to be situated substantially in the center of the arrangement of the four posts 42b of the frame 42.

The insoluble anode 14 is a square board fixed on the stand 43. A hole 14a is bored substantially through the center of the anode 14. The anode 14 is formed, for example, of a base material of titanium and an oxide of platinum or iridium deposited thereon to a thickness of 20 to 50 μm. Thus, the anode 14 is an insoluble anode which never causes the plating solution to change its composition, and can prevent penetration of impurities. A frame body 43a is fitted on the anode 14 in a liquid-tight manner with the aid of a seal member 43b. The height of the frame body 43a is substantially twice the thickness of the anode 14. Holes 43c and 43d are bored substantially through the respective centers of two facing side walls of the frame body 43a.

The housing 45, which is square in shape as viewed from above (FIG. 17), is composed of a lower frame 50, an intermediate frame 51, an upper frame 52, a top lid 53, an inner gear 54 interposed between the lower and intermediate frames 50 and 51, and a slip ring 55 for current collection interposed between the intermediate and upper frames 51 and 52. All these members are firmly fixed together for integral formation. A large-diameter hole 50a, used to contain the rotating body, is bored through the center of the lower frame 50 of the housing 45. Supporting members 57, 57 are fixed individually to two opposite sides of the upper surface of the top lid 53, protruding sideways therefrom.

The rotating body 46 is contained in the housing 45, and its basal portion 46a is rotatably housed in the hole 50a of the lower frame 50 of the housing 45 with a narrow gap left between the basal portion 46a and the lower frame 50. The upper end of a shaft 46b is rotatably supported by the top lid 53 and projects upward through a shaft hole 53a in the top lid 53. In this state, a lower end face 46c of the basal portion 46a of the rotating body 46 faces a top surface 14b of the anode 14 in parallel relation at a predetermined distance therefrom.

As shown in FIGS. 16 and 18, a plurality of holes 46d, e.g., four in number, are bored through the basal portion 46a of the rotating body 46, extend parallel to the axial direction and are arranged at regular intervals in the circumferential direction. A second rotating body 60 is rotatably contained in each of these holes 46d. The rotating body 60 is rotatably supported in the hole 46d, with a narrow gap around it, by means of a bearing (not shown). The cathode 1 is grasped and fixed in a hole in the lower end face of each rotating body 60 by means of a chuck mechanism 110. The cathodes 1 are electrically connected to the slip ring 55 by means of their corresponding conductive members (not shown) and brushes 103. A gear 65 is fixed on the upper end face of each rotating body 60. The gears 65 are in mesh with the inner gear 54 attached to the housing 45.

A motor 70 for driving the drive mechanism 47 (FIG. 16) is fixedly mounted on the top lid 53 of the housing 45. A gear 72, which is mounted on the rotating shaft of the motor 70, is in mesh with a gear 73 which is fixedly screwed on the upper end face of the shaft 46b of the rotating body 46.

A motor 80 for driving the drive mechanism 48 is fixedly mounted on the top plate 42c of the frame 42 shown in FIG. 16. The motor 80 serves to drive a screw shaft 85 and also to drive a screw shaft 86, for use as a driven shaft, through the medium of a pulley 83, a belt 87, and a pulley 83. The respective free ends of the screw shafts 85 and 86 are screwed individually in threaded holes 57a, 57a of their corresponding supporting members 57, 57 of the housing 5.

Power supply cables 21 and 22 are fixed to one side face of the anode 14 (FIG. 16) and a predetermined position of the upper surface of the slip ring 55, respectively.

One end of a plating solution passage (duct) 140 is connected in a liquid-tight manner to the hole 14a of the anode 14 from below the anode. The other end of the passage 140 communicates with the plating solution tank 33 through the pump 17. Open ends of passages 141 and 142, on one side thereof, are connected in a liquid-tight manner to the holes 43c and 43d, respectively, of the frame body 43a of the anode 14. The respective other ends of the passages 141 and 142 are connected to the plating solution tank 33.

The operation of the rotary high-speed plating apparatus 41 will now be described. First, the motor 80 for the drive mechanism 48 is driven to rotate the screw shafts 85 and 86, so that the housing 45 is raised to and stopped at an upper limit position indicated by two-dot chain line in FIG. 16. At this time, the lower end of the housing 45 is situated off and above the frame body 43a.

Then, the second rotating bodies 60 of the rotating body 46 are fitted individually with the cathodes 1 which are each composed of the conductive substrate 2 to be plated. The motor 80 for the drive mechanism 48 is driven to rotate the screw shafts 85 and 86 reversely to the aforesaid case, so that the housing 45 is moved to and stopped at the position indicated by the full line in FIG. 16. In this state, the lower end of the housing 45 is fitted in the frame body 43a in a liquid-tight manner, and the top surface 14b of the anode 14 and the individual cathodes 1 face parallel to one another at a predetermined distance. The plating solution is fed from the plating solution tank 33 into the liquid-tight cavity portion 13, defined between the top surface 14b of the anode 14 and the lower end face 46c of the rotating body 46, via the pump 17 and the duct 140. Thus, the cavity portion 13 or the space between the anode 14 and the cathodes 1 is filled with the plating solution. The plating solution fed into the cavity portion 13 is returned to the plating solution tank 33 from either side through the passages 141 and 142.

After the supply of the plating solution is started, the motor 70 for the drive mechanism 47 is driven to rotate the rotating body 46, for example, in the counterclockwise direction, as indicated by arrow CC in FIG. 18. As the rotating body 46 rotates in this manner, the second rotating bodies 60 are rotated in the clockwise direction, as indicated by arrows C in FIG. 18, through the medium of the inner gears 65 in mesh with the inner gear 54. These rotating bodies 60 rotate (or revolve on their own axes) at a rotating speed of, e.g., 10 m/sec to 30 m/sec. If the rotating bodies 60 or the cathodes 1 are rotated at such a speed in the plating solution, the polarized layer of the metallic concentration of the plating solution in contact with the cathodes 1 becomes very fine, so that the Reynolds number Re of the plating solution flow exceeds 2,900 (Re>2,900). For any portion of the plating solution in contact with the cathodes 1, moreover, the Reynolds number Re is not less than 2,300 (Re>2,300).

The aforementioned DC power source is turned on with the metallic-concentration polarized layer of the plating solution, in contact with the cathodes 1, kept very fine, thereby causing a required DC current to flow successively through the power supply cable 21, anode 14, plating solution, cathodes 1, carbon brushes 103, slip ring 55, and power supply cable 22. Thus, those end faces of the cathodes 1 opposed to the top surface 14b of the anode 14 are plated.

After the passage of a predetermined time, the aforesaid current supply is interrupted to stop the operations of the pump 17 and the drive motor 70, thereby bringing the plating of the cathodes 1 to an end. The cathodes 1 are removed from the rotating bodies 60 by reversely following the aforementioned process of their mounting.

In the rotary high-speed plating apparatus, the cathodes are rotated at high speed in the plating solution in order to make the metallic-concentration polarized layer of the plating solution very fine, so that the plating solution can be supplied to the liquid-tight cavity portion 13 at only a low flow rate. Accordingly, some advantages, such as miniaturization of the pump, economy of electric power, reduction in running cost, etc., can be obtained. Further, there is no need of an approach run of the plating solution for the very fine polarized layer of the metallic concentration of the plating solution, which has conventionally been required. Consequently, such a favorable effect as a reduction of the apparatus size can be enjoyed.

Thus, according to the process of the present invention, high-speed plating is performed by means of the high-speed plating apparatus shown in FIGS. 11 to 18, thus permitting electrolytic precipitation of copper film at an efficiency 10 to 200 times as high as that of the conventional plating technique, and ensuring a high efficiency of production. By setting the plating solution speed, current density, etc., according to the predetermined conditions, moreover, the surface roughness of electrolytically precipitated copper film and the size of deposited crystalline particles can be adjusted to desired values.

The high-speed plating apparatus for effecting the process of the present invention is not limited to the apparatus described above, and must only be a plating apparatus which can provide a turbulence with the Reynolds number Re of about 2,300 or more.

EXAMPLES

EXAMPLES 1–4

Table 1 shows the results of an evaluation test on copper-clad laminates produced by the process of the present invention and processes for comparison. In this evaluation test, pinholes formed in the electroformed copper foil, the transferability, the peeling strength between the copper foil 6 and the insulating substrate 10, the elongation percentage of the copper foil 6, etc., were evaluated varying several conditions including the surface roughness of the conductive substrate 2, the electrolytic conditions for the metal film 5 and the cooper foil 6, and the roughening conditions for the copper foil 6. The following are testing conditions other than those shown in Table 1, which are common to all the sample circuit boards.

TABLE 1

| Item | Surface Roughness of Conductive Substrate ($\mu$m) | Electrolytic Conditions for Metal Film | | Electrolytic Conditions for Copper Foil | | | Electrolytic Conditions for Roughening Process | | |
|---|---|---|---|---|---|---|---|---|---|
| | | Current Density (A/cm$^2$) | Solution Contact Speed (m/sec) | Current Density (A/cm$^2$) | Solution Contact Speed (m/sec) | Evaluation | Current Density (A/dm$^2$) | Solution Contact Speed (m/sec) | Evaluation |
| Example 1 | 0.13 | — | — | 2.0 | 20 | ○ | 36 | 0.2 | ○ |
| Example 2 | 0.13 | 1.2 | 8 | 1.2 | 10 | ○ | 36 | 0.2 | ○ |
| Example 3 | 0.18 | 1.2 | 8 | 1.2 | 4 | ○ | 40 | 0.3 | ○ |
| Example 4 | 0.18 | 2.0 | 8 | — | — | ○ | 40 | 0.3 | ○ |
| Control 1 | 0.18 | 2.0 | 20 | 1.2 | 10 | x | 36 | 0.3 | ○ |
| Control 2 | 0.23 | 2.0 | 20 | 2.0 | 22 | x | 36 | 0.2 | ○ |
| Control 3 | 0.08 | 0.8 | 6 | 4.0 | 22 | ○ | 18 | 0.2 | x |
| Control 4 | 0.25 | 0.8 | 6 | 4.2 | 20 | ○ | 40 | 0.3 | ○ |
| Control 5 | 0.06 | — | — | 1.2 | 10 | x | — | — | — |

| Item | Occurrence of Pinholes in Copper Foil | Evaluation on Transfer Lamination | | | | |
|---|---|---|---|---|---|---|
| | | Transferability*[1] | Peeling Value Strength (kg/cm) | | Elongation % of Copper Circuit | Synthetic Evaluation |
| Example 1 | 50–60/dm$^2$ (size: 20–30 $\mu$m) | ○ 130 | ○ | 1.6*[2] | 23 | ○ |
| Example 2 | 3–4/dm$^2$ (size: 20 $\mu$m or less) | ○ 130 | ○ | 1.9 | 23 | ○ |
| Example 3 | 3–4/dm$^2$ (size: 20 $\mu$m or less) | ○ 150 | ○ | 2.1 | 18 | ○ |
| Example 4 | 3–4/dm$^2$ (size: 20 $\mu$m or less) | ○ 150 | ○ | 2.1 | 18 | ○ |
| Control 1 | — | x 310 | ○ | 1.9 | 8 | x |
| Control 2 | — | ○ | ○ | 1.9 | 25 | x |
| Control 3 | nil | ○ 90 | x | 0.7 | 22 | x |
| Control 4 | " | x 310 | ○ | 2.1 | 22 | x |
| Control 5 | — | — | — | — | — | x |

Circles indicate nondefectiveness.
Crosses indicate defectiveness.
*[1]Figures indicate peeling values between conductive substrate and copper foil (Example 1), between conductive substrate and metal film (Examples 2 and 4; Controls 1 to 5), and between metal film and copper foil (Example 3).
*[2]Figures indicate peeling values between copper foil and insulating substrate.

Conductive Substrate:
Material: Single hardened stainless-steel plate (SUS630).
Surface Treatment: Polishing to the roughness shown in Table 1 by using a rotary buffing apparatus with oscillator.
Metal Film:
Material: Thin copper film (deposited to a thickness of 3 $\mu$m on the surface of the conductive substrate for Examples 2 and 4 and Controls 1 to 4, and to a thickness of 70 $\mu$m for Example 3).
Electrolytic Conditions: Interelectrode distance of 11 mm; use of a copper sulfate plating solution containing 180 g/l sulfuric acid.
Copper Foil Electroforming:

Electrolytic Conditions: Interelectrode distance of 11 mm; use of a copper sulfate plating solution containing 180 g/l sulfuric acid; deposited film thickness of 35 μm (9 μm for Control 3).

Roughening Process: (Nodular plating)

Electrolytic Conditions: Use of a mixed solution containing 100 g/l copper sulfate, 50 g/l sulfuric acid, and 30 g/l potassium nitrate; deposited film thickness of 3 μm.

Insulating Substrate:
Material: Glassepoxy G-10.
Examination of the Occurrence of Pinholes:

The copper-clad laminate was placed on a light table in a darkened room, and the copper foil surface was observed using a stereoscopic microscope with 100× magnification, for the measurement of the number and size of pinholes present in 100×100 mm area. The results are shown in Table 1.

When one or more pinholes with a diameter of 100 μm or more existed per 1 dm², the pinholes in all were regarded as many.

In Table 1, the electrolytic conditions for the metal film 5 and the copper foil 6, and the roughening conditions for the copper foil 6 of Examples 1 to 4, prepared by the process of the present invention, all comply with the requirements provided by the present invention. The time required for the deposition of the copper foil is very short, the number of pinholes formed is small, and the transferability, the peeling strength between the copper foil 6 and the insulating substrate 10, and the elongation percentage of the copper foil 6 are all satisfactory. The synthetic evaluations for Examples 1 to 4 are all "non-defective" (circles).

If the current density exceeds its upper limit value provided by the process of present invention when the copper foil 6 is electrolyzed, nodular plating or the so-called "plating scald" is caused, and the elongation percentage of the formed copper foil 6 is as low as 8%. Thus, the copper foil cannot be used for circuits for flexible substrates (Control 1). If the solution contact speed of the electrolytic solution exceeds its upper limit value provided by the process of the present invention, the copper foil plating layer peels off too early (Control 2).

If the current density at the time of electroplating, in the process of roughening the surface of the copper foil 6, is lower than its lower limit value provided by the process of the present invention, the plated surface is lustrous and cannot enjoy rough-surface plating (Control 3). If the surface of the copper foil 6 transferred to the insulating substrate 10 is roughened only insufficiently, the peeling value obtained between the copper foil 6 and the insulating substrate 10 is 0.7 kg/cm, which indicates lack of adhesion strength.

In Control 5 in which the surface roughness of the conductive substrate (single plate) is low, on the other hand, the metal film 5 or the copper foil 6 is separated (peeled too early) from the conductive substrate 2 during its formation. In Control 4 in which the surface roughness exceeds its upper limit value, the adhesion strength between the conductive substrate 2 and the metal film 5 or the copper foil 6, during the transfer step, is so great that the metal film 5 or the copper foil 6 partially remains on the conductive substrate 2. If the surface roughness of the conductive substrate 2 is great, moreover, a number of pinholes are produced in the metal film 5 or the copper foil 6. When the insulating substrate 10 is stacked for lamination, the bonding agent of the insulating substrate 10 penetrates these pinholes. The bonding agent in the pinholes sticks to the surface of the conductive substrate 2, so that the insulating substrate 10 and the conductive substrate 2 adheres so strongly to each other that the transferability is lowered.

Thus, Controls 1 to 5, in which some of the conditions including the surface roughness of the conductive substrate 2, the electrolytic conditions for the copper foil 6, and the roughening conditions for the copper foil 6 are not in compliance with the requirements provided by the present invention, are subject to the drawbacks as aforesaid. The synthetic evaluations for Controls 1 to 5 are all "defective" (crosses).

EXAMPLES 5-8

First, 15 plates of SUS304, each having a length of 760 mm, a width of 560 mm, and a thickness of 1.6 mm, were prepared.

One surface of each of the 15 plates was ground by about 90 μm deep, by subjecting it to a successive random grinding process which includes 8 stages of polishing cloth using 220# grit emery, 4 stages of polishing cloth using 320# grit emery, both by means of a rotary grinding machine with an oscillation width of 15 mm and at a line speed of 1.0 m/min, and a final 400# grit sandblasting by means of a liquid honing machine with 10 gun nozzles and an oscillation width of 10 mm, to obtain an average surface roughness of 0.37 μm.

Among these plates, 3 plates were subjected to a successive polishing process including 3 stages of 400# grit, 5 stages of 600# grit, and 5 stages of 600# grit, by means of a rotary grinding machine with an ocillation width of 15 mm and at a line speed of 0.5 m/min, to obtain an average surface roughness of 0.11 μm (optically measured gloss value: 430±20).

On the ground surface of each of the remaining 12 plates was formed a plating layer of nickel-cobalt alloy which has the composition, electroforming stress value, and Vickers hardness as shown in Table 2, and which has a thickness of about 200 μm, to obtain 4 types (groups) of substrates, each including 3 plates.

TABLE 2

|  | Composition (% by weight) | | Electroforming Stress Value (psi) | Vickers Hardness (Hv) | Evaluation |
| --- | --- | --- | --- | --- | --- |
|  | Ni | Co |  |  |  |
| Group 1 | 72 | 28 | (−) 650-1200 | 450 | ∘ |
| Group 2 | 61 | 39 | (+) 2000-3200 | 480 | Slightly Bent |
| Group 3 | 78 | 22 | (−) 3600-4200 | 420 | Slightly Bent |
| Group 4 | 68 | 32 | (+) 150-960 | 450 | ∘ |

Of these substrates, those in Groups 2 and 3 were slightly bent in the directions of the tension stress and pressure-bonding stress, respectively. When these plates were used under the conditions of 200° C. and 45 kg/cm², the alloy layers were peeled slightly at the edges of the stainless-stell plates. The plates in Groups 1 and 4 showed no abnormality in their appearance and retained the Vickers hardness of the order of 400 even after they were subjected to 120 times of heating/cooling and pressurizing test.

Subsequently, those surfaces of the plates in each Group formed with the plating layer were subjected to a polishing process including 5 stages of 600# grit and 5 stages of 800#, by means of a rotary grinding machine with an oscillation width of 15 mm and at a line speed of 0.5 m/min, to obtain an average surface roughness of 0.09 μm (optically measured gloss value: 450±30).

Then, all the surfaces of the 15 substrates were subjected to chrome plating to obtain a chrome layer of 0.05 to 0.10 μm thick, and then subjected to high-speed plating using the copper sulfate plating solution and the current density of 2 A/cm$^2$, at solution contact speeds as shown in Table 3, to obtain a copper foil of 5 μm or 9 μm thick.

Each substrate with a copper foil thereon was stacked on one surface of a prepreg having a thickness of 50 μm. The resulting structures were hot-pressed at 180° C. and 35 kg/cm$^2$, and then cooled to 60° C. in 30 minutes, followed by the separation process to obtain copper-clad laminates.

The occurrence of pinholes was examined by observing the copper foil surface of each copper-clad laminate placed on a light table in a darkened room, by using a stereoscopic microscope with 100× magnification, to measure the number and size of pinholes present in 100×100 mm area. The results of the measurement are shown in Table 3.

TABLE 3

| | Number of Pinholes Solution Contact Speed (m/min) | | | | | | Size of Pinholes (μm) | Evaluation |
|---|---|---|---|---|---|---|---|---|
| | 2 | 4 | 6 | 8 | 12 | 24 | | |
| Group 1 | 6 | 7 | 0 | 0 | 0 | 0 | 5–10 | ○ |
| Group 2 | 2 | 4 | 0 | 1 | 0 | 0 | less than 5 | ○ |
| Group 3 | 7 | 2 | 2 | 1 | 0 | 0 | less than 5 | ○ |
| Group 4 | 2 | 2 | 5 | 2 | 3 | 1 | 5–10 | ○ |
| Group with no alloy layer | 69 | 46 | 11 | 12 | 9 | 11 | less than 115 | x |

Those substrates on which the nickel-cobalt alloy layer was formed, such as the substrates of Groups 1 to 4, had only a few pinholes formed on the alloy layer, and also the size of the pinholes was small. This means that the defects of the polished surface of the SUS304 plate were eliminated by forming the nickel-cobalt alloy layer.

INDUSTRIAL AVAILABILITY

A process for producing a copper-clad laminate according to the present invention combines the so-called single plate pressing method and high-speed plating method. According to this process, therefore, a copper film with a high elongation percentage fitted specially for use in flexible circuit boards can be formed in a short time, thus ensuring high productivity and simple steps of production. Accordingly, the necessary equipment for the manufacture of the copper-clad laminate and the installation space therefor can be reduced. If a metal film is interposed between a conductive substrate and a copper foil, the copper foil, which is formed by plating, cannot easily suffer pinholes or other defects, and the transferability is improved. Besides these and various other advantages, the process of the invention is advantageous in that the thickness of the copper foil, in particular, is 10 μm or less, so that an ultrathin copper-clad laminate adapted for use in high-density conductor circuit boards can be obtained. Thus, the process of the invention is highly useful in the field of conductor circuit boards.

What is claimed is:

1. A process for producing a copper-clad laminate, comprising the steps of:
   providing a planar cathode comprising an electrically conductive substrate and a metal film 70 to 250 μm thick plated onto a surface of said electrically conductive substrate; said metal film being a two-component alloy layer consisting essentially of 60% to 80% by weight of nickel and 20% to 40% by weight of cobalt;
   forming a copper foil having a thickness of not more than 10 μm directly on the surface of said metal film at a deposition speed of 25 to 100 μm/min, by electroplating under the conditions that said planar cathode is spaced from a planar anode at an interelectrode distance of 3 to 30 mm from each other, from a copper sulfate plating solution at a temperature of 45° to 70° C. supplied such that said plating solution comes into contact with the electrodes at a solution contact speed of 6.0 to 12.0 m/sec and applying a current density of 0.8 to 4.0 A/cm$^2$, said copper plating solution comprising from 0.2 to 2.0 mol/l of copper, from 50 to 220 g/l of sulfuric acid and from 30 to 800 ppm of chloride ion, said copper foil adhering to said metal film with a force of adhesion smaller than that between said cathode and said metal film;
   roughening the surface of said copper foil;
   laminating and bonding together an insulating substrate, and said planar cathode, with the thus formed copper foil therebetween, by applying heat and pressure; and
   separating only said copper foil and said insulating substrate together from said planar cathode so that said metal film remains on the surface of said conductive substrate.

2. The process according to claim 1, wherein said metal film comprises a two-component alloy plated layer essentially consisting of nickel and cobalt, and a chrome layer formed on said two-component alloy plated layer.

3. The process according to claim 2, wherein said chrome layer has a thickness of 0.05 to 3 μm.

4. The process according to claim 1, wherein said cathode and said anode are both fixed, and said plating solution is supplied between these electrodes.

5. The process according to claim 1, wherein said cathode is rotated so that said solution contact speed of said plating solution is obtained.

6. The process according to claim 1, wherein said surface-roughening step is a step of plating the surface of said copper foil so that a deposited film thickness of 2 to 5 μm is obtained from an acid plating solution containing copper ions and nitrate ions, at a current density of 0.25 to 0.85 A/cm$^2$, a solution contact speed of said acid plating solution with respect to the electrodes ranging from 0.1 to 0.8 m/sec, and an interelectrode distance of 26 to 50 mm.

7. The process according to claim 1, wherein said copper sulfate plating solution is at a temperature of from 60° to 65° C.

8. The process according to claim 4, wherein said copper sulfate plating solution is at a temperature of from 60° to 65° C.

9. The process according to claim 5, wherein said copper sulfate plating solution is at a temperature of from 60° to 65° C.

10. The process according to claim 6, wherein said copper sulfate plating solution is at a temperature of from 60° to 65° C.

11. A process for producing a copper-clad laminate, comprising the steps of:

forming a copper foil having a thickness of not more than 10 μm directly on the surface of a planar, electrically conductive substrate at a deposition speed of 25 to 100 μm/min, by electroplating under the conditions that said conductive substrate serving as a cathode is spaced from a planar anode at an interelectrode distance of 3 to 30 mm from each other, from a copper sulfate plating solution at a temperature of 45° to 70° C. supplied such that said plating solution comes into contact with the electrodes at a solution contact speed of 6.0 to 12.0 m/sec and applying a current density of 0.8 to 4.0 A/cm$^2$, said copper plating solution comprising from 0.2 to 2.0 mol/lit of copper, from 50 to 220 g/lit of sulfuric acid and from 30 to 800 ppm of chloride ion;

roughening the surface of said copper foil;

laminating and bonding together an insulating substrate and said conductive substrate, with the thus formed copper foil therebetween, by applying heat and pressure; and separating said copper foil and said insulating substrate together from said conductive substrate.

12. The process according to claim 11, wherein said surface-roughening step is a step of plating the surface of said copper foil so that a deposited film thickness of 2 to 5 μm is obtained from an acid plating solution containing copper ions and nitrate ions, at a current density of 0.25 to 0.85 A/cm$^2$, a solution contact speed of said acid plating solution with respect to the electrodes ranging from 0.1 to 0.8 m/sec, and an interelectrode distance of 26 to 50 mm.

* * * * *